United States Patent

Cao

[11] Patent Number: 5,965,281
[45] Date of Patent: Oct. 12, 1999

[54] ELECTRICALLY ACTIVE POLYMER COMPOSITIONS AND THEIR USE IN EFFICIENT, LOW OPERATING VOLTAGE, POLYMER LIGHT-EMITTING DIODES WITH AIR-STABLE CATHODES

[75] Inventor: Yong Cao, Goleta, Calif.

[73] Assignee: Uniax Corporation, Santa Barbara, Calif.

[21] Appl. No.: 08/888,316

[22] Filed: Jul. 3, 1997

Related U.S. Application Data

[60] Provisional application No. 60/037,159, Feb. 4, 1997.

[51] Int. Cl.$^6$ .............................. H05B 33/00; H01L 35/24
[52] U.S. Cl. .......................... 428/690; 313/498; 313/504; 313/506; 257/40
[58] Field of Search ..................................... 428/690, 917; 313/504–509, 498; 257/40

[56] References Cited

U.S. PATENT DOCUMENTS

| | | |
|---|---|---|
| 4,539,507 | 9/1985 | VanSlyke et al. . |
| 4,885,211 | 12/1989 | Tang et al. . |
| 5,059,862 | 10/1991 | VanSlyke et al. . |
| 5,247,190 | 9/1993 | Friend et al. . |
| 5,408,109 | 4/1995 | Heeger et al. . |

FOREIGN PATENT DOCUMENTS

WO96/00983  11/1996  WIPO .

OTHER PUBLICATIONS

Cao et al., *Appl. Phys. Lett.*, 68 (1996) 3218.
Aratani et al., *J. Electron. Mater.*, 22 (1993), 745.
Bradley, *Synth. Met.*, 54 (1993), 401.
Braun et al., *Appl. Phys. Lett.*, 58 (1991), 1982.
Brown et al., *Appl. Phys. Lett.*, 61 (1990), 2793.
Burroughes et al., *Nature*, 347 (1990), 539.
de Mello et al., *Synth. Met.* (preprint, Proceedings of ICSM '96, Synth. Met. (in press).
Greenham et al., *Nature*, 365 (1993), 628.
Hu et al., *J. Appl. Phys.*, 76 (1994), 2419.
Kang et al., *Macromolecules*, 29 (1996), 165.
Kido et al., *IEEE Trans. Electron Devices*, 40 (1993), 1342.
Parker et al., *Appl. Phys. Lett.*, 65 (1994), 1272.
Pei et al., *J. Amer. Chem. Soc.*, 118 (1996), 3922.
Pei et al., *Science* 269 (1995), 1086.
Zhang et al., *J. Electron. Mater.*, 23 (1994), 453.

*Primary Examiner*—Charles Nold

[57] ABSTRACT

The addition of a highly polarizable additive such as an organic anionic surfactant to an electrically active polymer improves the electrical properties of the polymer. When such an additive is added to an electroluminescent organic polymer this mixture can be used in diodes having an anode contacting a layer of this mixture as the active light-emitting layer and an air-stable metal cathode having a work function larger than 4 eV. The external efficiency and brightness versus voltage are significantly improved compared to results obtained with the same electroluminescent polymer used alone with high work function (>4.0 eV) metal cathodes. Specifically, device performance with indium/tin-oxide (ITO) as the anode, poly(2-methoxy-5-(2'-ethyl-hexyloxy)-1,4-phenylene vinylene), MEH-PPV, as the electroluminescent polymer, lithium nonylphenoxy ether sulfate as the surfactant additive and aluminum as the cathode is comparable to or better than that obtained with high performance devices using calcium as the cathode.

26 Claims, 13 Drawing Sheets

ELECTRICALLY ACTIVE POLYMER COMPOSITIONS AND THEIR USE IN EFFICIENT, LOW OPERATING VOLTAGE, POLYMER LIGHT-EMITTING DIODES WITH AIR-STABLE CATHODES

This application is a continuation of Provisional Application No. 60/037,159, filed Feb. 4, 1997, abandoned.

FIELD OF THE INVENTION

This invention relates to electrically active (e.g. conjugated) polymer-containing compositions and their use in solid state electrical devices such as light-emitting diodes. More specifically, this invention relates to combinations of active polymer with highly polarizable additives and their use as components of solid state electronic devices such as electroluminescent or electron-injecting layers in light-emitting diodes. The combinations show remarkably enhanced external quantum efficiency and can be used with high work function air-stable metal cathodes.

BACKGROUND OF THE INVENTION

The semiconductor light-emitting diode is a solid state device that emits light when a voltage is applied across it. In conventional inorganic semiconductor devices, a p-n junction is fabricated, consisting of a single crystal semiconductor formed with one part of the crystal doped with positive charged carriers (designated p-type) and another part of the crystal doped with negative charged carriers (designated n-type). It is a basic feature of all such p-n junctions that their chemical composition and, hence, doping profile is static, or fixed in position in the host crystal. During operation, charge carriers are injected into or removed from the junction through electrical contacts external to the junction region.

Junction regions are introduced in a variety of manners. Abrupt junctions, in which the transition between the n- and p-type regions are relatively narrow, are typically fabricated by alloying a solid impurity (for example, a metal) with the semiconductor, or by employing one of a number of epitaxial growth techniques on crystalline semiconductor substrates. Graded junctions, in which the transition region is relatively broader, are produced by diffusion or ion implantation of impurities into the host semiconductor. These technologically demanding manufacturing processes make it both difficult and expensive to fabricate large area displays. Moreover, such devices are inherently brittle and lack the mechanical and processing advantages generally associated with organic, and especially polymeric, materials. For these reasons, there has been considerable interest for many years in organic materials for use as the active (light-emitting) components of light-emitting diodes.

A number of electroluminescent devices have been disclosed which use organic materials as an active light-emitting layer in a sandwich architecture. For example, S. A. Van Slyke and C. W. Tang in U.S. Pat. No. 4,539,507 disclosed a device having a bilayer of two vacuum-sublimed films of small organic molecules sandwiched between two contacts. R. H. Friend et al. in U.S. Pat. No. 5,247,190 disclosed a device having a thin dense polymer film made up of at least one conjugated polymer sandwiched between two contacts. Because these are electric field-driven devices, the active electroluminescent layer must be very thin (typically about 1000 angstroms thick) and uniform. In these devices, excess charge carriers are injected through the contacts into the light-emitting semiconductor layer by processes well known in the study of metal-semiconductor interfaces (see, e.g., M. A. Lampert and P. Mark, Current Injection in Solids, Academic Press, NY, 1970). Dissimilar metals were used for the contacts to facilitate the injection of electrons at one contact and the injection of holes at the other. As a result, the current-voltage characteristic curves of these devices show a pronounced asymmetry with respect to the polarity of the applied voltage, like that typical of the response of diodes. Hence, the rectification ratio of such devices is high, typically greater than $10^3$, and light is emitted for only one polarity of the applied voltage.

Among other drawbacks, the devices disclosed by S. A. Van Slyke and C. W. Tang and by R. H. Friend et al. suffer from the need to use metals of relatively low work function to inject sufficient numbers of electrons into the active layers to produce efficient light output at low drive voltages. Because such metals are readily oxidized, they are a source of device degradation in ambient conditions and require passivating packaging. To improve efficiency and operational stability, low work function metals such as Mg and Li were alloyed with more stable metals with higher work function such as Al or Ag and used as the cathode for organic LEDs (for example C. W. Tang and S. A. Van Slyke, U.S. Pat. No. 4,885,211 (1989); S. A. Van Slyke and C. W. Tang, U.S. Pat. No. 5,059,862 (1991)). The efficiencies were higher than when the higher work function metal was used alone. However, when the proportion of a higher work function metal was increased beyond a certain level, the initial and extended performance were significantly reduced. A double-layer cathode was also proposed where a high work function metal was overcoated on the top of the low work function metal (for example, J. Kido, K. Nagai and Y. Okamoto, IEEE Trans. Electron Devices, 40 (1993), 1342).

The class of materials suitable for organic LEDs was expanded by Burroughes et al (J. H. Burroughes, D. D. C. Bradley, A. R. Brown, R. N. Marks, K. MacKay, R. H. Friend, P. L. Burns and A. B. Holmes, Nature, 347 (1990), 539) who demonstrated that LEDs could be made from conjugated polymers such as poly(phenylenevinylene), PPV. Devices using aluminum as a cathode disclosed by Burroughes et al had low brightness and low efficiency (0.002%) (D. D. C. Bradley, Synth. Met., 54 (1993), 401) and operated only at very high voltages (40 volts) (R. H. Friend, J. H. Burroughes and D. D. Bradley, U.S. Pat. No. 5,247,190 (1993)). Braun et al (D. Braun and A. J. Heeger, Appl. Phys. Lett., 58 (1991), 1982) showed that by using the soluble PPV derivative, poly(2-methoxy-5-(2'-ethylhexyloxy)-1,4-phenylenevinylene), with a low work function electron injecting cathode, such as calcium, polymer LEDs could achieve high brightness with external quantum efficiencies of order 1% (U.S. Pat. No. 5,408,109).

For a given polymer, a common practice is to use conduction band and valence band offsets at semiconductor heterojunction interfaces to achieve carrier confinement within the active electroluminescent (EL) layer. Electron-transport layers, which contain either small molecules or an electrically active polymer, are placed between the luminescent layer and cathode in order to enhance the quantum efficiency through charge carrier confinement (N. C. Greenham, S. C. Morrati, D. D. C. Bradley, R. H. Friend and A. B. Holmes, Nature, 365 (1993), 628; A. R. Brown, D. D. C. Bradley, J. H. Burroughes, R. H. Friend, N. C. Greenham, P. L. Holmes and A. Kraft, Appl. Phys. Lett., 61 (1990), 2793; S. Aratani, C. Zhang, K. Pakabaz, S. Hoger, F.Wudl and A. J. Heeger, J. Electron. Mater., 22 (1993), 745). The quantum efficiencies are also improved, when the electron-transporting molecules are blended with the luminescent polymer (C. Zhang, S. Hoger, K. Pakbaz, F. Wudl and A. J. Heeger, J. Electron. Mater., 23 (1994), 453; Z. Hu, Y. Yang and F. E. Karasz, J. Appl. Phys., 76 (1994), 2419I; D. Parker and Q. Pei, Appl. Phys. Lett., 65 (1994), 1272; I. N. Kang, D. H. Hwang, H. K. Shim, T. Z. Zyung, and J. J. Kim, Macromolecules, 29 (1996), 165). Although these approaches are promising, the device performance remains well below that obtained with devices which use a low work function metal as cathode; the latter providing significantly higher efficiency and higher brightness at low operating voltages.

Q. Pei et al discovered the polymer light-emitting electrochemical cell (LEC) (Q. Pei, G. Yu, C. Zhang, Y. Yang, and A. J. Heeger, Science 269 (1995), 1086; Q. Pei and F. Klavetter, U.S. patent application Ser. No. 08/268763 (Jun. 28, 1994)) which contains solid electrolyte in the electroluminescent layer. The ionic conducting character of this device allows the creation of a p-n junction in situ by electrochemical doping. Because carrier injection occurs through ohmic contacts into the doped n-type and p-type regions, stable metals such as Al and Au can be used for the anode and cathode. Thus, the quantum efficiency in LECs is relatively independent of the work function of the cathode and anode since there is no need to match the work function of the electrodes to the $\pi$ and $\pi^*$ energies of a luminescent polymer. However, since the in situ creation of the p-n junction is limited by ionic transport (the ionic conductivity of the active layer), the time required for the device to turn-on is considerably longer than in conventional LEDs, where all processes are electronic.

STATEMENT OF THE INVENTION

We have found an improvement in polymer-based electrically active layer materials which overcomes many of the disadvantages encountered heretofore. We have found that highly polarizable organic additives may be advantageously used in combination with electrically active, e.g., conjugated, organic polymers to give materials having unexpected electrical properties. These highly polarizable organic additives, commonly classed as anionic surfactant materials, when dissolved or dispersed in an electrically-active polymer or present as a separate layer intermediate the active layer and the electron injecting electrode, remarkably improve electron injection into these polymers from relatively high work function, stable metal cathodes. This permits higher efficiency organic polymer-based light-emitting devices with excellent environmental stability. This invention provides best results when the active polymer is an electroluminescent conjugated organic polymer.

With the addition of one or more of the polarizable additives, single layer LEDs can be fabricated with high work function, air-stable metals such as Al as the cathode and a transparent material such as ITO as the anode. These LEDs show surprisingly high external quantum efficiency, and they operate at low voltages. The quantum efficiency and operating voltage are comparable to those obtained using low work function metals such as Ca as the cathode. Aluminum is particularly advantageous as the cathode metal. It has excellent air stability and readily permits patterning the cathode as required in the fabrication of arrays of polymer LEDs for active display ks (for example, for alphanumeric displays). A particular advantage of an Al cathode is that it is entirely compatible with Al contacts and interconnects widely employed in integrated and hybrid circuitry.

Thus, in one aspect this invention provides mixtures of one or more electrically active polymers, particularly electroluminescent polymers and especially conjugated electroluminescent polymers with one or more highly polarizable organic additives, especially highly polarizable organic anionic surfactant additives. These mixtures are useful as electrically active materials in solid state devices. When the polymer is electroluminescent the mixtures can serve as electroluminescent media in light-emitting devices such as light-emitting diodes. These polymer-additive mixtures are also useful as electron-injecting layers in solid state devices.

In another aspect, this invention is directed to solid state devices employing these mixtures as electrically active layers or as electron-injecting layers.

In another aspect, this invention is directed to an electroluminescent device comprising an anode, an electroluminescent layer containing an electroluminescent polymer and an organic additive with high polarizability (especially an organic anionic surfactant), and a cathode. The cathode can be fabricated from a metal with relatively high work function and consequently with good environmental stability. The polarizable additive changes the interfacial properties between the cathode and the electroluminescent polymer and thereby improves electron injection into the electroluminescent polymer.

Thus, in one aspect this invention provides combinations of one or more electrically active polymers, particularly electroluminescent polymers and especially conjugated electroluminescent polymers with one or more highly polarizable organic additives, especially highly polarizable organic anionic surfactant additives. These combinations are useful as electrically active materials in solid state devices. When the polymer is electroluminescent the combinations can serve as electroluminescent media in light-emitting devices such as light-emitting diodes. These polymer-additive combinations are also useful as electron-injecting layers in solid state devices.

In another aspect, this invention is directed to solid state devices employing these combinations as electrically active layers or as electron-injecting layers.

In another aspect, this invention is directed to an electroluminescent device comprising an anode, an electroluminescent layer containing an electroluminescent polymer and an organic additive with high polarizability (especially an organic anionic surfactant), and a cathode. The cathode can be fabricated from a metal with relatively high work function and consequently with good environmental stability. The polarizable additive changes the interfacial properties between the cathode and the electroluminescent polymer and thereby improves electron injection into the electroluminescent polymer.

DETAILED DESCRIPTION OF THE INVENTION

The invention is based on the discovery that incorporating highly polarizable additives into electrically active polymers provides admixtures having improved electrical properties. The addition of such an additive serves to improve electron injection in polymer LEDs high work function (>4.0 eV) materials such as aluminum as cathode. These improved LEDs exhibit quantum efficiencies which are comparable to or even higher than can be achieved with low work function materials such as calcium. This important observation is completely unexpected, as one skilled in the art would anticipate that dilution of the conjugated polymer would dramatically increase the operating voltage, with only minor effect on the quantum efficiency (see for example, I. N. Kang, D. H. Hwang, H. K. Shim, T. Zyung, and J. J. Kim, Macromolecules, 29 (1996), 165).

The mixtures of this invention are made up of a major proportion of the electrically active polymer and a minor proportion of the polarizable additive, that is less than 50% by weight. The additive in this invention is an insulator; it neither conducts electronically nor ionically. Consequently, this invention is completely different and distinct from the prior art, where an electron-transporting agent with relatively high electron mobility was placed between the active, e.g. electroluminescent, polymer and the cathode, or an electron-transporting agent was blended into the electroluminescent polymer. Additionally, this invention is different and distinct from the prior art where a solid electrolyte with high ionic conductivity was blended into the electroluminescent polymer, and a p-n junction was created in situ, in the latter case, since the in situ creation of the p-n junction is limited by ionic transport, the time required for the device to turn-on is considerably longer than in conventional LEDs, where all processes are electronic.

This mixture of electrically active polymer and polarizable additive is useful as an electron-injecting layer in electronic devices. When the electrically active polymer is electroluminescent, as is often the case, the layer can serve as the active light-emitting layer of an LED. Diodes using this material have rectification ratios larger than $10^3$.

Figure 13:
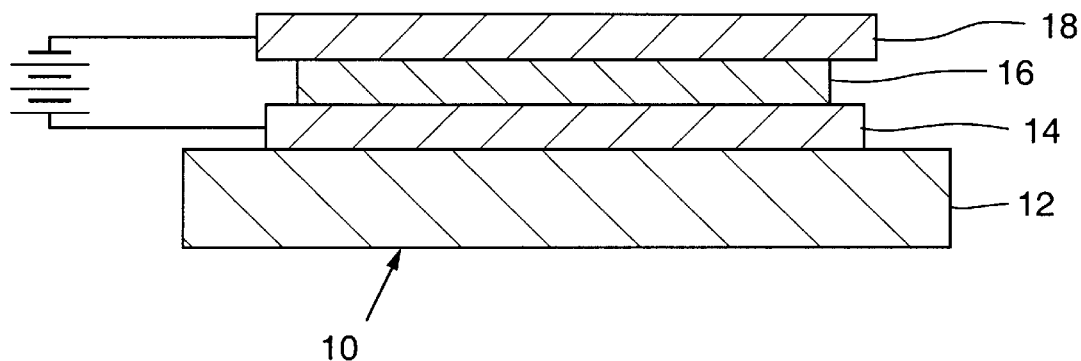
FIGS. 13, 14 and 15 are not-to-scale, schematic cross-sectional views of representative solid state electronic devices embodying the invention.

As shown in FIG. 13, an LED 10 might typically include a layer 16 of the admixture of electroluminescent polymer and additive sandwiched between a transparent anode 14 and a cathode 18. This assembly may be carried on a support 12, which is transparent to permit light to be emitted through it. Because of the presence of the additive in the electroluminescent layer, cathode 18 can be formed of a high work function metal and still provide good efficiency.

Figure 14:
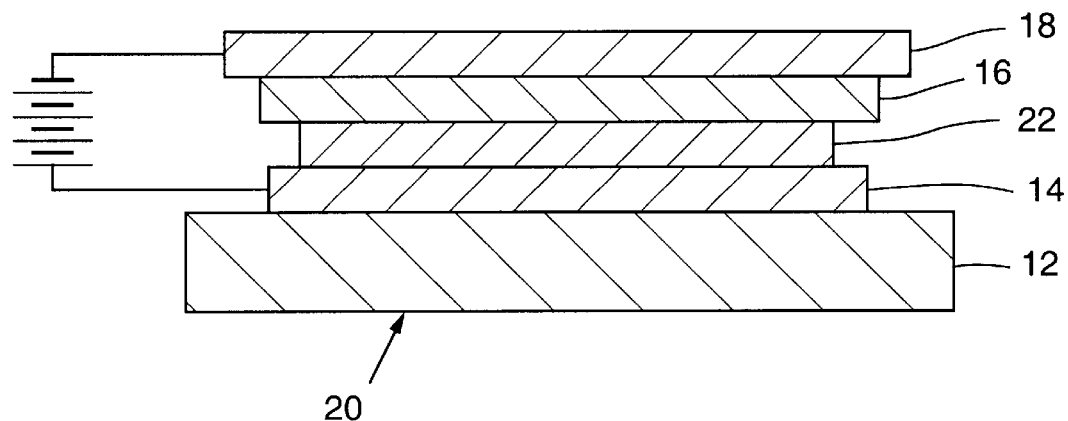

A representative device configuration where the electrically active polymer-anionic surfactant mixture serves as an electron-injecting layer is shown in FIG. 14. In FIG. 14, device 20 includes support 12, anode 14, outer layer 16, cathode 18 and additionally an electron-injecting layer 22 which is made up of a mixture of electrically active polymer and anionic surfactant additive.

Figure 15:
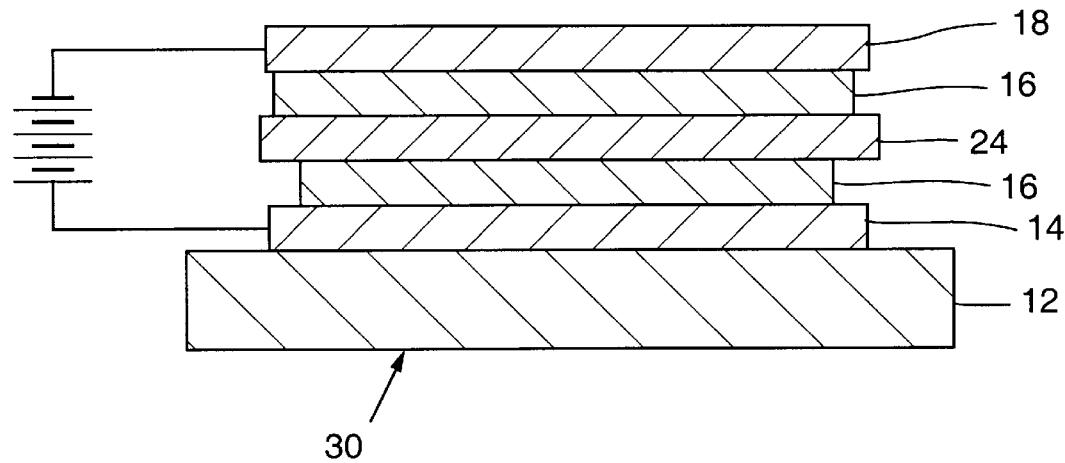

The invention can be employed in other organic polymer-based electronic devices such as polymer-grid triodes. Such a device is shown as 30 in FIG. 15. Device 30 includes a support 12, anode 14 and cathode 18. Active layer 16, which is an electronically active organic polymer admixed with additive has a polymer grid 24 imbedded in it with the active polymer passing through the grid. This grid is conductive and can be a source of electrical signal output or, if a grid voltage is applied to it can alter the electrical characteristics of the device in the manner of a grid voltage in a classic vacuum tube triode. The additive improves the performance of this device. These device configurations are merely representative.

The LED devices which employ the electrically active polymer-additive mixtures can be a high work function cathode (>4.0 eV). These LEDs have an external quantum efficiency at least two orders of magnitude larger than the same device fabricated without the additive. In the case of a metallic Al cathode (work function equal to 4.19 eV), the external quantum efficiency is comparable with that of similar devices fabricated with low work function electrodes such as calcium (2.71 eV). Moreover, the operating voltage for such a device is significantly decreased in comparison with LEDs using an Al cathode without additive present in the active layer.

The Active Polymer

The mixtures of this invention, and the devices which employ them, include an electrically active polymer. This is an organic polymer which is affected by a voltage applied across it. This can give rise to an electronic effect such as rectification or switching or electro-optical effect such as electroluminescence. In some of the preferred embodiments, the electroluminescent polymer comprises at least one conjugated polymer or a co-polymer which contains segments of π-conjugated moieties. Conjugated polymers are well known in the art (see, e.g., Conjugated Polymers, J.-L. Bredas and R. Silbey edt., Kluwer Academic Press, Dordrecht, 1991). Representative examples include, but are not limited to the following:

(i) poly(p-phenylene vinylene) and its derivatives substituted at various positions on the phenylene moiety;
 (ii) poly(p-phenylene vinylene) and its derivatives substituted at various positions on the vinylene moiety;
 (iii) poly(arylene vinylene), where the arylene may be such moieties as naphthalene, anthracene, furylene, thienylene, oxadiazole, and the like, or one of the moieties with functionalized substituents at various positions;

(iv) derivatives of poly(arylene vinylene), where the arylene may be as in (iii) above, substituted at various positions on the arylene moiety;

(v) derivatives of poly(arylene vinylene), where the arylene may be as in (iii) above, substituted at various positions on the vinylene moiety;

(vi) co-polymers of arylene vinylene oligomers with non-conjugated oligomers, and derivatives of such polymers substituted at various positions on the arylene moieties, derivatives of such polymers substituted at various positions on the vinylene moieties, and derivatives of such polymers substituted at various positions on the arylene and the vinylene moieties;

(vii) poly(p-phenylene) and its derivatives substituted at various positions on the phenylene moiety, including ladder polymer derivatives such as poly(9,9-dialkyl fluorene) and the like;

(viii) poly(arylenes) and their derivatives substituted at various positions on the arylene moiety;

(ix) co-polymers of oligoarylenes with non-conjugated oligomers, and derivatives of such polymers substituted at various positions on the arylene moieties;

(x) polyquinoline and its derivatives;

(xi) co-polymers of polyquinoline with p-phenylene and moieties having solubilizing function;

(xii) rigid rod polymers such as poly(p-phenylene-2,6-benzobisthiazole), poly(p-phenylene-2,6-benzobisoxazole), poly(p-phenylene-2,6-benzimidazole), and their derivatives;

and the like.

The Additive

The additive admixed with the electrically active polymer is a highly polarizable organic material typically containing a highly polarizable functionality corresponding to a strong acid such as a sulfate or a phosphate or the like. Typically the additive is an organo sulfate or a mono- or diorgano phosphate. These materials are not ionic conductors under anhydrous conditions and are represented by the following structures:

R*—O—SO$_3^-$M$^+$, R*—O—PO$_3^{-2}$M$_2^+$ and (R*—O)$_2$—PO$_2$—M$^+$ wherein R* is a hydrophobic organo group and M$^+$ is a proton or a cation, such as an ammonium or a metal cation.

Commonly, R* is hydrocarbyl or oxyhydrocarbyl having from about 5 carbons to about 100 carbons and up to about 40 oxygens.

Good results have been achieved using these organo sulfates and phosphates referred to in the surfactant industry by the group names "ether sulfate" and "ether phosphate"; (see, e.g. Surfactants in Consumer Products, Theory, Technology and K, J. Falbe ed., Springer-Verlag, Berlin, 1987). These ether sulfates and ether phosphates have R* groups which include a poly(ethylene oxide) polyether region and typically an aliphatic or mixed aromatic-aliphatic region.

Among the ether sulfates, preference is given to materials having the following common structure:

wherein R is alkyl, alkenyl, or alkylaryl, or alkenylaryl;
M$^+$ is a proton or a cation; and
n is an integer from 2 to 40 inclusive In the case of the ether phosphates, preference is given to materials having the common structures:

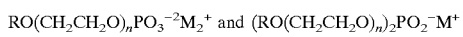

wherein R, M$^+$ and n are as already defined.

The R groups present in the ether sulfates and ether phosphates include, without limitation, alkyls of 2 to about 20 carbons, preferably from about 6 to about 20 carbons, and more preferably from about 8 to 18 carbons, both linear and branched; alkenyls of the same carbon sizes with up to 3 olefinic unsaturations; alkylaryls with an aryl portion having 6 carbons (phenyl) or 10 carbons in two fused rings (naphthyl) and from 1 to 3 saturated alkyl substituents, each having the carbon sizes recited for the alkyl R groups; and alkenylaryls with the same aryl portions and from 1 to 3 alkenyls; each having the carbon sizes and olefinic unsaturations recited for the alkenyl R's.

Representative examples of R's present in the ether sulfates and ether phosphates include, as alkyls, n, iso, and tert butyls, hexyl, 2-ethylhexyl, nonyl, n-decyl, 2,2-dimethyloctyl, undecyl, tetradecyl, hexadecyl, heptadecyl and the like; as alkenyls, oct-3-enyl, dodec-3,6-dieneyl and the like; as alkylaryls, octylphenyl, nonylphenyl, dihexylphenyl, dodecylphenyl, hexadecylphenyl, dinonylphenyl, didecylphenyl, octylnaphthyl, and the like.

In these formulae, n represents the average number of units of ethylene oxide per molecule, that is the number of (—CH$_2$CH$_2$O$^-$) repeat units. n can range from about 2 to about 40, and especially from about 3 to about 35.

In these formulae, M$^+$ is a proton or a cation, typically ammonium or a metal cation such as Li$^+$, Na$^+$, K$^+$, Ca$^{++}$, Mg$^{++}$, or the like. Lithium, sodium, potassium, rubidium and cesium cations are preferred, with lithium being a most preferred cation.

The anionic ether sulfate and ether phosphate surfactants are widely used as high foaming detergents in consumer products and are produced by almost every surfactant company in the world. For example, the products of several companies are listed in Table I and used in the development of the current invention.

TABLE 1

Representative Ether Sulfates and Phosphates

| Company | Product Name | Type |
|---|---|---|
| Rhone-Poulenc | Alipal CO436 | ammonium salt nonylphenoxy ether sulfate (n = 4) |
| Rhone-Poulenc | Alipal CO433 | sodium salt nonylphenoxy ether sulfate (n = 4) |
| Rhone-Poulenc | Rodafac RE-410 | polyoxyethylene nonylphenyl ether phosphonic acid (n = 4) |
| Rhone-Poulenc | Rodafac RM-410 | polyoxyethylene dinonylphenyl ether phosphonic acid (n = 4) |
| Rhone-Poulenc | Rodafac PL-620 | polyoxyethylene alkyl ether phosphonic acid (n = 6) |
| Rhone-Poulenc | Rhodapex ESY | Sodium salt lauryl ether sulfate (n = 1) |
| Rhone-Poulenc | Rhodapex ES-2 | Sodium salt lauryl ether sulfate (n = 2) |
| Rhone-Poulenc | Rhodapex ES | Sodium salt lauryl ether sulfate (n = 3) |
| Cyanamid | Aerosol NPES 458 | ammonium salt nonylphenoxy polyoxyethylene ether sulfate (n = 4) |
| Cyanamid | Aerosol NPES 930 | ammonium salt nonylphenoxy polyoxyethylene ether sulfate (n = 9) |

TABLE 1-continued

Representative Ether Sulfates and Phosphates

| Company | Product Name | Type |
|---|---|---|
| Cyanamid | Aerosol NPES 2030 | ammonium salt nonylphenoxy polyoxyethylene ether sulfate (n = 20) |
| Cyanamid | Aerosol NPES 3030 | ammonium salt nonylphenoxy polyoxyethylene ether sulfate (n = 30) |
| Pilot | Calform EA-603 | ammonium salt lauryl ether sulfate (n = 3) |

*n is the average number of ethoxyether groups per molecule.

The preferred lithium salts can be prepared from these commercially available products by a simple procedure know in the art and described in the examples. These lithium salts are often referred to herein by using the product name plus "Li", for example, Li CO436 is the lithium salt of Alipal CO436. Other specific salts such as cesium salts are represented in the same way, for example Cs CO436, etc.

It will be appreciated that these materials are average structures and that the actual materials employed will often be mixtures of materials with varying degrees of ethoxylation, substitution, and the like.

Proportions and Preparation

The materials of this invention are mixtures of the electrically active polymer and polarizable additive. While most commonly a single active polymer is admixed with a single additive, it is possible to use mixtures of either or both component. The active, e.g. conjugated, polymer typically predominates in these materials. Representative weight proportions are:

| active polymer | 1 part by weight |
|---|---|
| additive | 0.99 to 0.001 part by weight. (just below 50% to about 0.1% by weight on an overall mixture basis) |
| preferably: | |
| active polymer | 1 part by weight |
| additive | 0.50 to 0.01 part by weight. (33% to about 1% by weight on an overall mixture basis) |
| and more preferably: | |
| active polymer | 1 part by weight |
| additive | 0.50 to 0.05 part by weight. (33% to about 5% by weight on an overall mixture basis) |

If mixtures of active polymers and/or additive are employed, these proportions shall be for the total.

Additional materials may be present in these admixtures. These materials can include bulk structural polymers, processing aids, and the like. These materials may be added in amounts typically taught in the art to be useful in electrically active polymer systems.

The mixtures of this invention are homogenous. Depending upon the degree of solubility of the materials in one another, they may be present as solid solutions or as dispersions of finely divided additive in the electrically active polymer. By "finely divided", it is meant that the size of the dispersed particles is on the micron scale or smaller.

The blends of active polymer and surfactant additive may be prepared in several manners.

For one, the active polymer and the additive can be milled together as solids. Alternatively, one or both of the materials can be melted and added as a liquid, if appropriate.

For another, the active polymer can be dissolved or suspended in a liquid and admixed with the additive, also as a solute or as a dispersed phase. Thereafter the liquid is removed. This is the most commonly used method.

For another, the polymer can be added as a monomer or as a prepolymer which is polymerized in-situ in the presence of the additive.

The Transparent Anode Layer

The active layer (electroluminescent layer of the LEDs) of this invention is bounded on one surface by an anode layer. In the case of LEDs, this anode is typically a transparent anode layer. When a substrate is present, the anode is typically between the substrate and the active layer comprising electrically active polymer and additive. This anode layer can be a transparent conductive layer made of a material with work function above 4.5 eV serving as a hole-injecting layer. Typical materials include metals such as aluminum, silver, platinum, gold, palladium, tungsten, indium, copper, iron, nickel, zinc, lead and the like; metal oxides such as lead oxide, tin oxide, indium/tin-oxide and the like; graphite; doped inorganic semiconductors such as silicon, germanium, gallium arsenide, and the like; and doped conducting polymers such as polyaniline, polypyrrole, polythiophene, and the like. When metals such as aluminum, silver, platinum, gold, palladium, tungsten, indium, copper, iron, nickel, zinc, lead and the like are used, the anode layer must be sufficiently thin to be semi-transparent. Metal oxides such as indium/tin-oxide and conducting polymers such as polyaniline and polypyrrole are typically at least semitransparent.

The Cathode (Electron Injecting Contact)

In a preferred embodiment of this invention, the electron-injecting contact (the cathode) is fabricated from a high work function metal, from alloys of high work function metals, or from multi-layers of such metals. High work function metals are those having work function equal to or larger than 4.0 eV. These materials include aluminum, indium, copper and silver, with aluminum (work function 4.19 eV) being a particularly attractive material. The cathode layer is deposited using methods well-known in the art (e.g. thermal evaporation, sputtering, or electron-beam evaporation).

EXAMPLES

The following examples show various implementations of the invention. They are intended to be illustrative and not to limit the scope of the invention as defined by the claims.

Preparative Example A

Preparation of Lithium Ether Sulfate

Lithium salts of various ether sulfate anionic surfactants were prepared by the following common procedure: 10 g of aqueous solution (58% w/w) of tetra(oxy-1,2-ethanediyl), α-sulfo-ω-(nonylphenoxy)-ammonium salt (Alipal CO436, Rhone-Poulenc) was diluted 9 times into 90 g of water and passed twice through a column filled with DOWEX 50WX2-100 ion-exchange resin(Aldrich). After evaporating the water by using a rotator evaporator, the resulting free acid was dried at 60° C. in a vacuum oven for 48 hours. A 1 M solution of the resulting acid in water was prepared and mixed with an equal volume of 1 M LiOH (Aldrich) solution in water under rigorous stirring. Complete neutralization was monitored by a pH meter by adding a small amount of the corresponding component until reaching pH=7.0. After most of the water was evaporated off, the remaining solid was dried further for 48 h at 60° C. in a vacuum oven. A 10% (w/V) solution of the Lithium ether sulfate in xylene was prepared and used for blending with the conjugated polymer. Some of the resulting lithium ether sulfates are listed in Table 2.

Preparative Example B

Preparation of Lithium Ether Phosphate

The lithium salt of ether phosphate can be prepared following exactly the same procedure as in Example A. However, since many surfactant producers supply ether phosphates in free acid form, the first step (preparation of free acid) can be omitted. The neutralization, drying and solution preparation are the same as in Example A. Some of the lithium ether phosphates and sulphates which were prepared are listed in Table 2.

TABLE 2

Examples of lithium ether sulfates and lithium ether phosphates prepared in this invention

| Maker | Brand Name of Commercial Ether Phosphate or Sulfate | Chemical Structure and Abbreviation of Corresponding Lithium Salt in this Invention |
|---|---|---|
| Rhone-Poulenc | Alipal CO436 | lithium salt nonylphenoxy ether sulfate (Li-CO436) |
| Rhone-Poulenc | Alipal CO433 | lithium salt nonylphenoxy ether sulfate (Li-CO433) |
| Cyanamid | Aerosol NPES 458 | lithium salt nonylphenoxy ether sulfate (n = 4) (Li-NPES458) |
| Cyanamid | Aerosol NPES 930 | ammonium salt nonylphenoxy ether sulfate (n = 9) (Li-NPES930) |
| Cyanamid | Aerosol NPES 2030 | lithium salt nonylphenoxy ether sulfate (n = 20) (Li-NPES2030) |
| Cyanamid | Aerosol NPES 3030 | lithium salt nonylphenoxy ether sulfate (n = 30) (Li-NPES3030) |
| Rhone-Poulenc | Rhodapex ESY | Sodium salt lauryl ether sulfate (n = 1) (Li-ESY) |
| Rhone-Poulenc | Rhodapex ES-2 | Sodium salt lauryl ether sulfate (n = 2) (Li-ES-2) |
| Rhone-Poulenc | Rhodapex ES | Sodium salt lauryl ether sulfate (n = 3) (Li-ES) |
| Pilot | Calform-EA603 | lithium lauryl ether sulfate (Li-EA603) |
| Rhone-Poulenc | Rodafac RE-410 | polyoxyethylene nonylphenyl ether phosphonic acid (LiRE410) |
| Rhone-Poulenc | Rodafac RM-410 | polyoxyethylene dinonylphenyl ether phosphonic acid (Li-NM410) |
| Rhone-Poulenc | Rodafac PL-620 | polyoxyethelene alkyl ether phosphonic acid (Li-PL620) |

Example 1

Light-emitting devices were fabricated in the following way: 15.0 μL of 10% (w/V) tetra(oxy-1,2-ethanediyl), α-sulfo-ω-(nonylphenoxy)-lithium salt in xylene was added into 2.5 mL 0.6% MEH-PPV. Thin films of MEH-PPV containing 0.1 part (w/w) of lithium nonylphenyl tetraethyleneoxide sulfate per part of MEH-PPV were spin-cast onto ITO-coated glass substrates. The layers were subsequently heated for 1 hour at 60° C. on a hot plate to eliminate residual traces of solvent. The coated substrates were then transferred into a thermal evaporator for deposition of the cathode; the cathode was formed by thermal evaporation of a 2000 Å thick aluminum layer onto the top of the electroluminescent layer.

Figure 1:
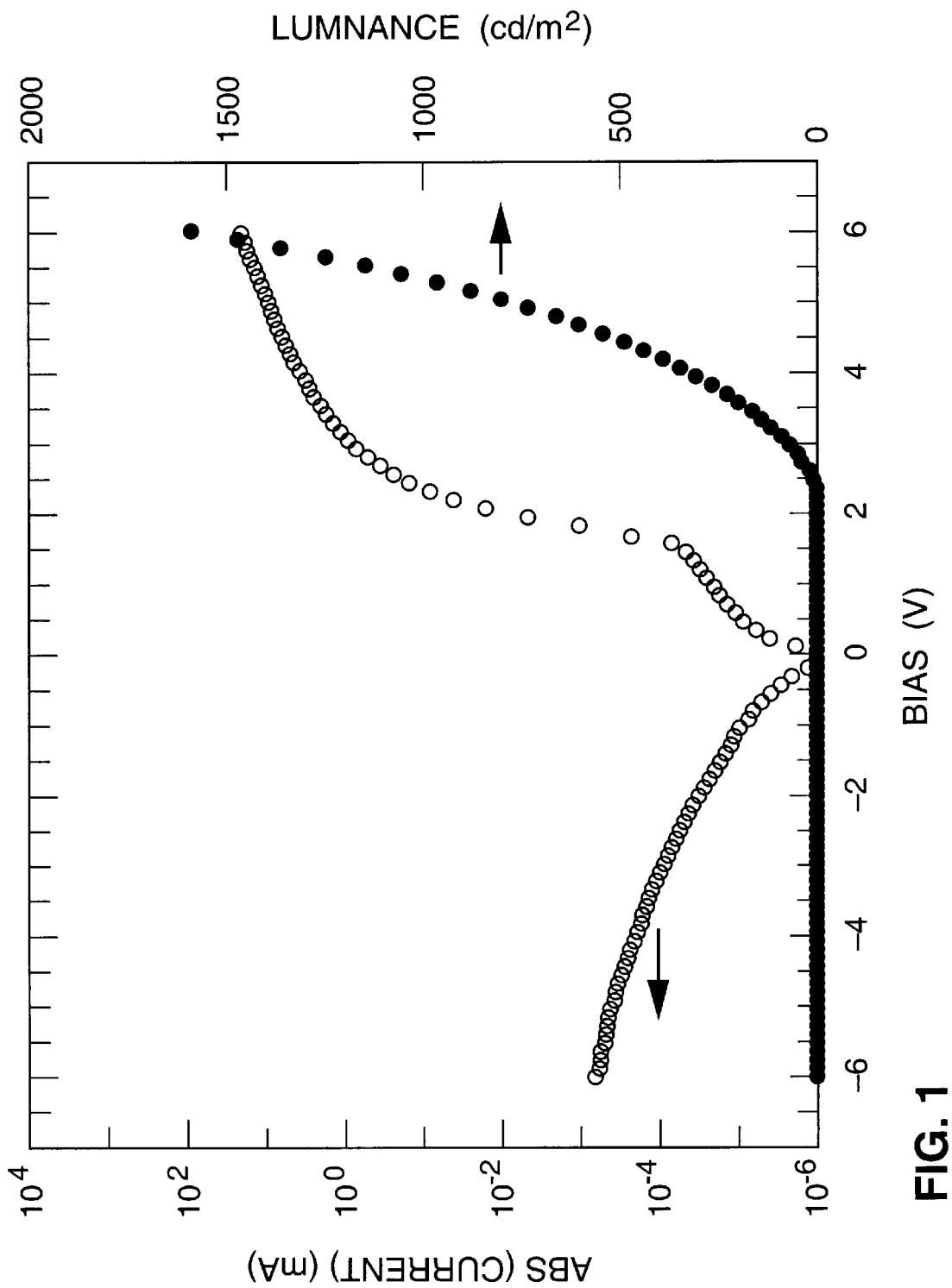
FIG. 1 is a graph that shows the current versus voltage (I-V) and light output of an LED in the following configuration: ITO/MEH-PPV+anionic surfactant/Al, where the proportion of surfactant to MEH-PPV active polymer is 0.10. The rectification ratio is larger than $10^4$, and the device can be operated at 5V.

Upon k of a voltage between the indium/tin-oxide and the aluminum contacts, emission of orange light was observed only when the ITO was wired as the positive terminal. This fact indicates that the device operates as a diode. FIG. 1 shows the I-V characteristic and light output of the device between −6 to +6 V. As can be seen from FIG. 1, the rectification ratio was larger than $10^4$. The light output reached 800 cd/$M^2$ at 5V. No light was observed in reverse bias; i.e. when ITO was wired as the negative terminal.

Figure 2:
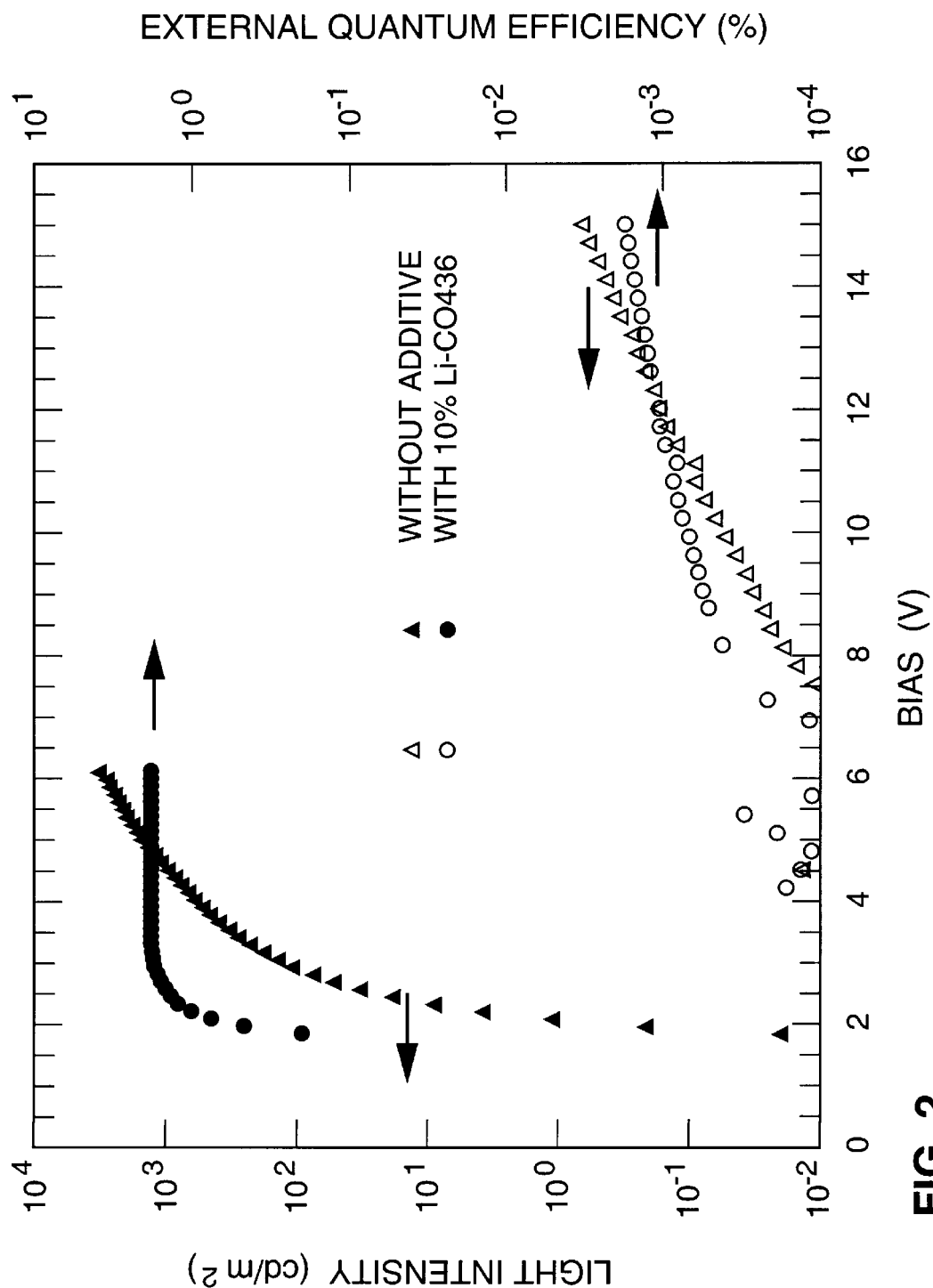
FIG. 2 is a graph that compares the external quantum efficiency of devices with and without anionic additive but otherwise identical.

FIG. 2 compares the quantum efficiency with and without the additive with Al as the cathode material. As published in many reports, for MEH-PPV LED devices with Al as the cathode, the quantum efficiency is generally less than 0.01%. However, the quantum efficiency for the device identical in every way but fabricated with MEH-PPV blended with the surfactant additive increased by more than two orders of magnitudes, to more than 2%.

This example demonstrates that the presence of small amounts of surfactant additive enables the fabrication of highly efficient polymer light-emitting diodes with stable Al cathodes.

Example 2

Figure 3:
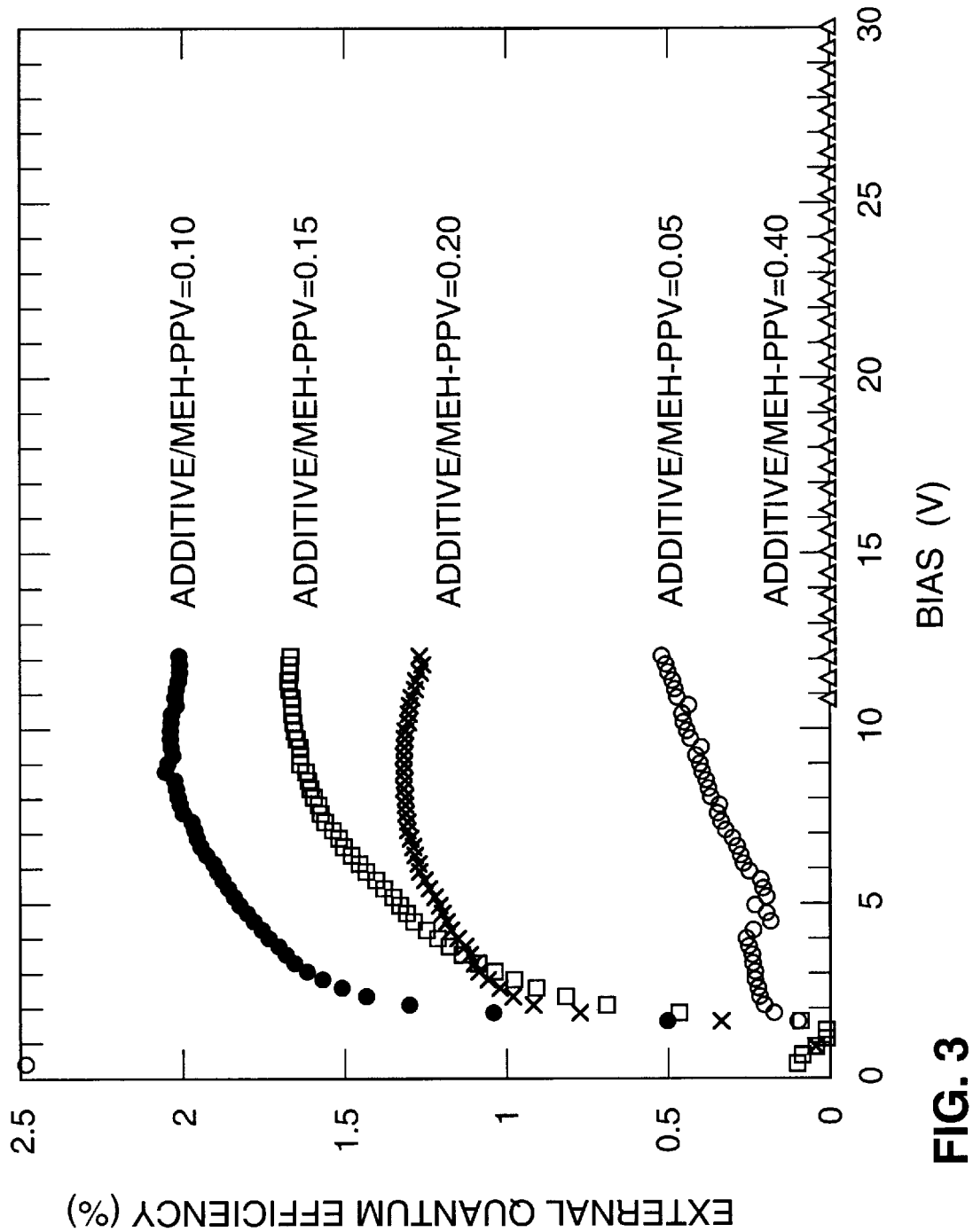
FIG. 3 is a graph that shows the change of external quantum efficiency of the devices of this invention with the concentration of additive in the active layer.

Example 1 was repeated and the ratio of the additive to MEH-PPV was varied to include the following values: 0.05, 0.15, 0.20, 0.40. FIG. 3 shows the dependence of the external quantum efficiency on the this ratio.

This example demonstrates that only small amounts (about 10%) of the additive are needed to provide a dramatic improvement in the efficiency of the polymer LED.

Example 3

Example 1 was repeated but Li-CO436 was replaced by Cs-CO436. The ratio of Cs-CO436 to MEH-PPV are 0.01 and 0.1. The device performance data that were obtained are listed in Table 3.

TABLE 3

Device performance of LEDs with cesium nonylphenyl ethylene oxide sulfate (Cs-CO436)

| | Device Performance | | | |
|---|---|---|---|---|
| Cs-CO436:MEH-PPV | V (V) | I (mA) | Luminance (cd/$m^2$) | Efficiency (%) |
| 0 | 15 | 3.9 | 0.7 | 0.002 |
| 0.01 | 10 | 38.3 | 37.0 | 0.05 |
| 0.10 | 8 | 12.4 | 160 | 0.64 |

Example 4

Example 1 was repeated using poly(oxy-1,2-ethanediyl), α-sulfo-ω-(nonylphenoxy)-lithium salts with different lengths of (ethyleneoxy) $(C_2H_4O)_n$; i.e. with n=9, 20, 30 and Lithium salt lauryl ether sulfate of different lengths of ($C_2H_4O$)n; i.e. with n=1,2,3 were used in place of the tetra(oxy-1,2-ethanediyl),α-sulfo-ω-(nonylphenoxy)-lithium salt(Li-CO436). The device performance data that were obtained are listed in Table 4.

TABLE 4

Device performance of LEDs with lithium nonylphenyl ethylene oxide sulfates with different lengths of ethoxide as additive.

| | | Device Performance | | | |
|---|---|---|---|---|---|
| Additive | n | V (V) | I (mA) | Luminance (cd/m$^2$) | Efficiency (%) |
| no additive | — | 15 | 3.9 | 0.7 | 0.002 |
| Li-NPES458 | 4 | 6.5 | 5.5 | 715 | 1.57 |
| Li-NPES930 | 9 | 5 | 2.0 | 78 | 0.95 |
| Li-NPES2030 | 20 | 8 | 11.2 | 595 | 0.64 |
| Li-NPES3030 | 30 | 6.5 | 8.1 | 854 | 1.27 |
| Li-ESY | 1 | 8 | 12.6 | 12 | 0.05 |
| Li-ES-2 | 2 | 5.7 | 5.0 | 72 | 0.7 |
| Li-ES | 3 | 3.9 | 5.0 | 268 | 2.5 |
| LI-EA603 | 3 | 6.0 | 9.9 | 475 | 1.44 |

This example demonstrates that ether sulfate, either aromatic (nonylphenyl) or alkyl, with different lengths of ethylene oxide units exhibit similar enhancement of quantum efficiency and light output over identical devices fabricated without the additive.

Example 5

Example 1 was repeated, but with the lithium salt of poly(oxy-1,2-ethanediyl-α-(dinonylphenyl-ω-hydroxy-phosphate (Li-RM410), poly(oxy-1,2-ethanediyl)-α-(nonylphenyl)-ω-hydroxy-branched phosphate (Li-RE410), and poly(oxy-1,2-ethanediyl)-α-(alkyl(C10–C16)-ω-hydroxy-phosphate (Li-PL610). The device performance data are listed in Table 5.

TABLE 5

Device performance of LED devices with lithium salts of different poly(oxy-1,2-ethanediyl)-aryl (or alkyl)-phosphates as additive

| | Device Performance | | | |
|---|---|---|---|---|
| surfactant* | V (V) | I (mA) | Luminance (cd/m$^2$) | Efficiency (%) |
| Li-RM410 | 8 | 14.7 | 666 | 1.36 |
| Li-RE410 | 6 | 11.8 | 368 | 0.94 |
| Li-PL620 | 8 | 12.4 | 348 | 0.85 |

*10% (w/w) of surfactant based on MEH-PPV in the solid film.

This Example demonstrates that the lithium salt of an anionic surfactant—ether phosphates as additive can enhance the performance of MEH-PPV devices.

Example 6

Example 1 was repeated, but different semiconducting polymers were used in the electroluminescent layer in place of MEH-PPV, including BUEH-PPV, CHEH-PPV(poly(2-cyclohexyloxy-5-(2'-ethyl-hexyloxy)-1,4-phenylene vinylene), BCHA-PPV(poly(bis-2,5-cholestanoxy)-1,4-phenylene vinylene), BCN-PF(poly(9,9-bis-(5-cyano-5-methylhexyl)-fluorene-2,7-diyl), BUEH-co-DEGEH-PPV (poly(2-butyl-5-(2'-ethyl-hexyl-1,4-phenylene vinylene-co-poly(2, -diethyleneglycoloxy-5-(2'-ethyl-hexyloxy) phenylene vinylene) and P3OT(poly-3-octyl-2,5-thiophene). The device performance data and electroluminescent color obtained from these device are listed in Table 6. Since the device performance with these electroluminescent polymers are all extremely poor with Al cathodes, we use the Ca cathode for the device without surfactant additive as comparison.

This example demonstrates that the polarizable surfactant additive significantly enhances the device performance with Al as the cathode not only for MEH-PPV as the luminescent polymer, but also more generally for electroluminescent polymers with different colors of emission.

TABLE 6

Effect of Li-CO436 on device performance using various electroluminescent polymers (other than MEH-PPV)

| | | | Device Performance | | | | |
|---|---|---|---|---|---|---|---|
| Electro-luminescent Polymer | Cathode | Additive* | Voltage (V) | Current (mA) | Luminance (cd/m$^2$) | Eff. (%) | Color |
| BCN-PF | Ca | — | 20 | 7.5 | 0.8 | .002 | Blue |
| BCN-PF | Al | Li-CO436 | 18 | 27.8 | 198.7 | 0.12 | |
| BUEH-PPV | Ca | — | 6.5 | 12.0 | 78.3 | 0.11 | green |
| BUEH-PPV | Al | Li-CO436 | 10 | 4.0 | 693 | 2.7 | |
| CHEH-PPV | Ca | — | 15 | 8.4 | 33.8 | 0.06 | green |
| CHEH-PPV | Al | Li-CO436 | 15 | 10.7 | 260.9 | 0.31 | |
| BCHA-PPV | Ca | — | 15 | 3.9 | 126.7 | 0.41 | yellow |
| BCHA-PPV | Al | Li-CO436 | 15 | 4.2 | 289.8 | 0.88 | |
| BUEH-co-DEGRH-PPVC | Ca | — | 20 | 6.7 | 42.9 | 0.08 | yellow |
| BUEH-c0-DEGEH-PPV | Al | Li-CO436 | 12 | 6.6 | 323.9 | 0.62 | |
| P3OT | Ca | — | 20 | 17.6 | 1.0 | r0d0007 | |
| P3OT | Al | — | 35 | 68.2 | 4.0 | 0.0007 | |
| P3OT | Al | Li-CO436 | 20 | 5.5 | 14.9 | 0.03 | |

*weight ratio of Li-CO436 to MEH was kept constant: 10%

Example 7

Example 1 was repeated, but the Al cathode was replaced by In, Pb, Ag, Cu and Au. Table 7 shows the device performance data obtained from these devices with MEH-PPV as the electroluminescent polymer.

TABLE 7

Device performance of LED devices with additive using different cathode materials

| Device | | Performance | | | |
|---|---|---|---|---|---|
| Additive | Cathode (f,eV) | V (V) | I (mA) | light (cd/m$^2$) | eff (%) |
| — | In(4.08) | 10 | 9.9 | 2.5 | 0.0005 |
| Li-CO436 | In | 8 | 35.4 | 638 | 0.22 |
| — | Pb(4.18) | 12 | 29.7 | 21 | 0.009 |
| Li-CO436 | Pb | 12 | 20.5 | 290 | 0.13 |
| — | Al(4.19) | 15 | 3.9 | 0.7 | 0.002 |
| Li-CO436 | Al | 6 | 18.4 | 3040 | 2.0 |
| — | Ag(4.64) | 12 | 12.6 | 20.2 | 0.02 |
| Li-CO436 | Ag | 12 | 15.3 | 528 | 0.41 |
| — | Cu(4.70) | 8 | 26.0 | 42 | 0.02 |
| Li-CO436 | Cu | 12 | 57.9 | 528 | 0.19 |
| — | Au(5.32) | 16 | 84.0 | 0.02 | 0.000003 |
| Li-CO436 | Au | 12 | 55 | 11 | 0.0025 |

This example demonstrates that the surfactant additives significantly enhance device performance not only for LEDs with Al electrodes, but also for devices fabricated with cathodes made from metals with work function equal to or larger than that of Al, for which the best device performance was recorded.

Example 8

Example 1 was repeated, with the ITO anode replaced by semitransparent gold (100 Å on a glass substrate) and by bilayer anodes in which the ITO was over-coated by hole-injecting conducting polymers, such as polyaniline (PANI-CSA/PAN blend), (U.S. patent application Ser. No. 08/205,519) and polythiophene (PEDT-PSS, Bayer trial product AI4071). The results are summarized in Table 8.

This example demonstrates that different anode layers can be used for fabrication of devices of this invention with similar improvements in device performance.

TABLE 8

Devices made according to Example 1 with different anode layers

| | Device Performance | | | |
|---|---|---|---|---|
| Anode | V (V) | I (mA) | Luminance (cd/m$^2$) | efficiency (%) |
| ITO | 12 | 2.9 | 463 | 1.90 |
| Au | 10 | 3.9 | 403 | 1.25 |
| ITO/PANI-CSA | 6 | 18.4 | 3040 | 2.00 |
| ITO/PEDT-PSS | 7 | 13.6 | 808 | 0.71 |

Example 9

To get insight into the origin of remarkable improvement of device performance with an Al cathode in the presence of the polarizable surfactant molecules, photovoltaic measurements were carried out to determine the open circuit voltage of the devices described in Example 1. The device was illuminated with white light for 20 seconds to build up photovoltaic potential. Subsequently, the I-V curve was run from 0 to 2 volts (in case of MEH-PPV) or to 0 to 4 volts (for BUEH-PPV). The external voltage will compensate the photovoltaic potential, and current will start from minus to plus. When the external potential becomes equal to the photovoltaic potential, the current goes to zero. Further increase in the external voltage increases the current in positive direction. Thus, the cross-over potential when current becomes zero gives the open circuit voltage.

Figure 4:
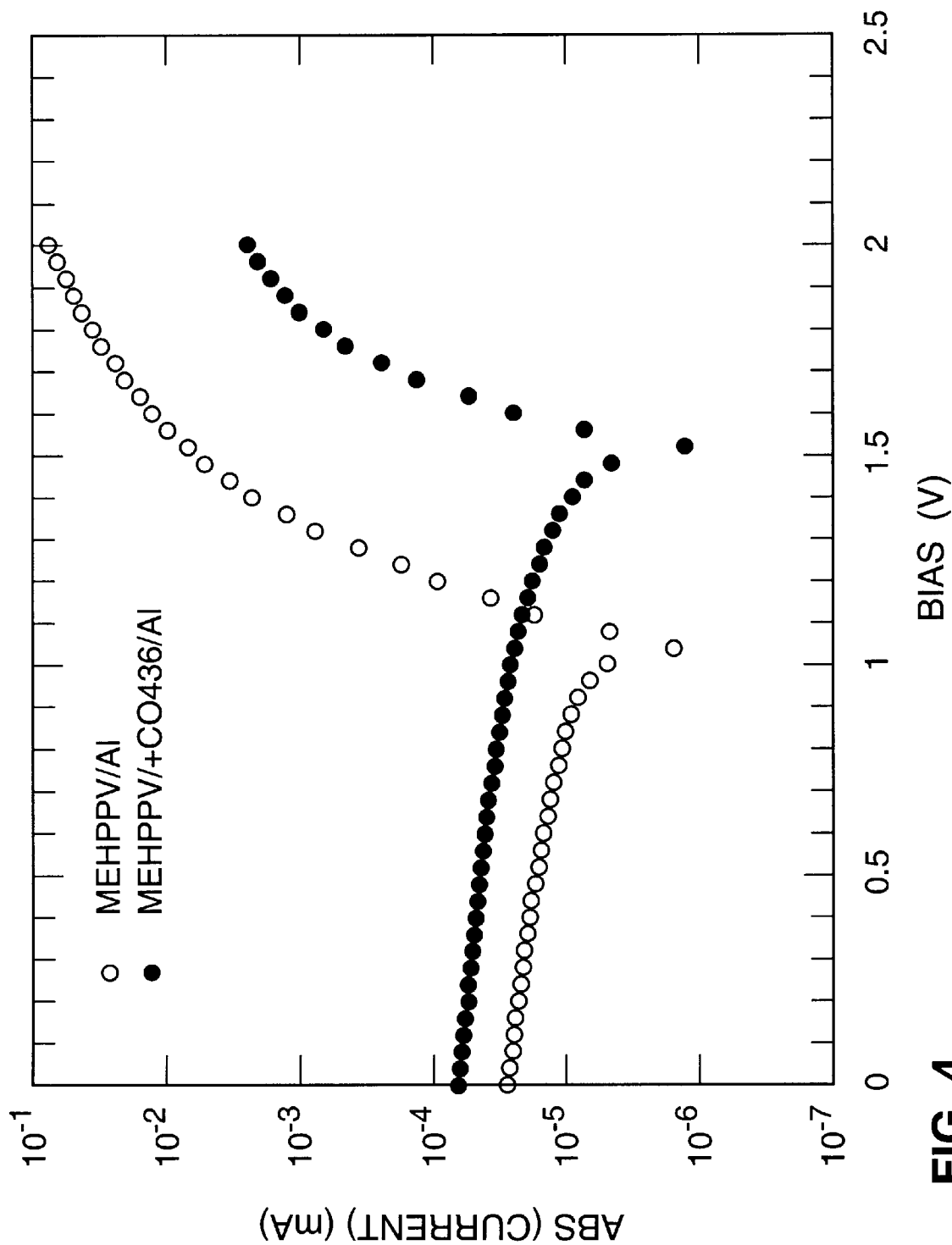
FIG. 4 is a graph that shows the results of photovoltaic measurements on devices made with and without additive (but otherwise identical).

FIG. 4 compares the open circuit voltage of devices with or without the additive. In the presence of additive, the open circuit voltage moves from ca. 1.1 V (which is equal to the difference between the work functions of the anode and the cathode in flat band configuration) moves to about 1.6 V, almost the same value as obtained using Ca as the cathode material. This result is fully consistent with the turn on in I-V curves of these devices (FIG. 1); i.e. also essentially equivalent to that obtained with Ca as the cathode material.

Figure 5:
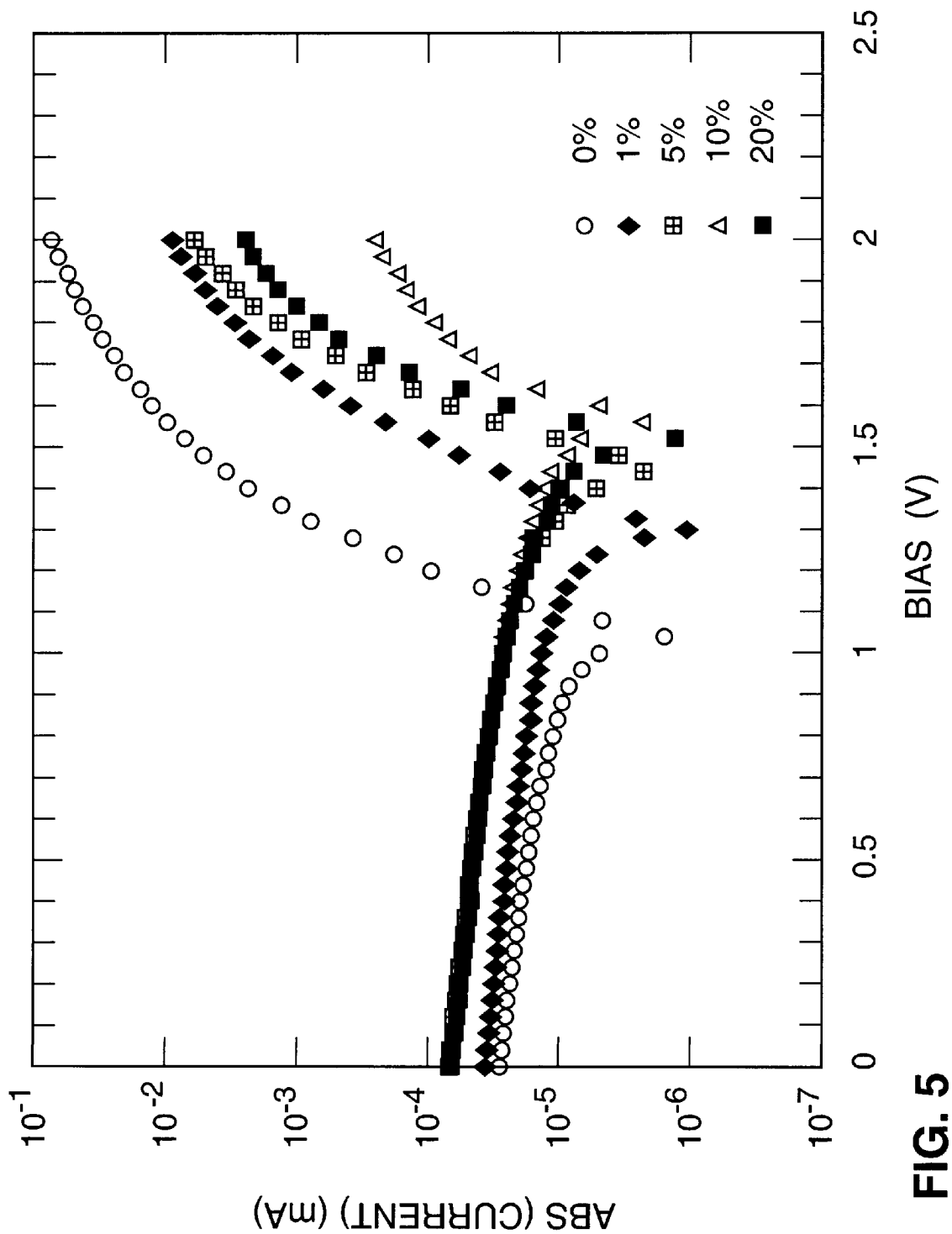
FIG. 5 is a graph that shows the open circuit voltage versus surfactant concentration for devices with different additive concentrations.

FIG. 5 depicts the open circuit voltage for different concentrations of Li-CO436. The open circuit voltage is quite sensitive with observable changes even with small amounts (as low as 1%) of additive. For additive concentrations above 10%, the open circuit voltage remains constant.

Figure 6:
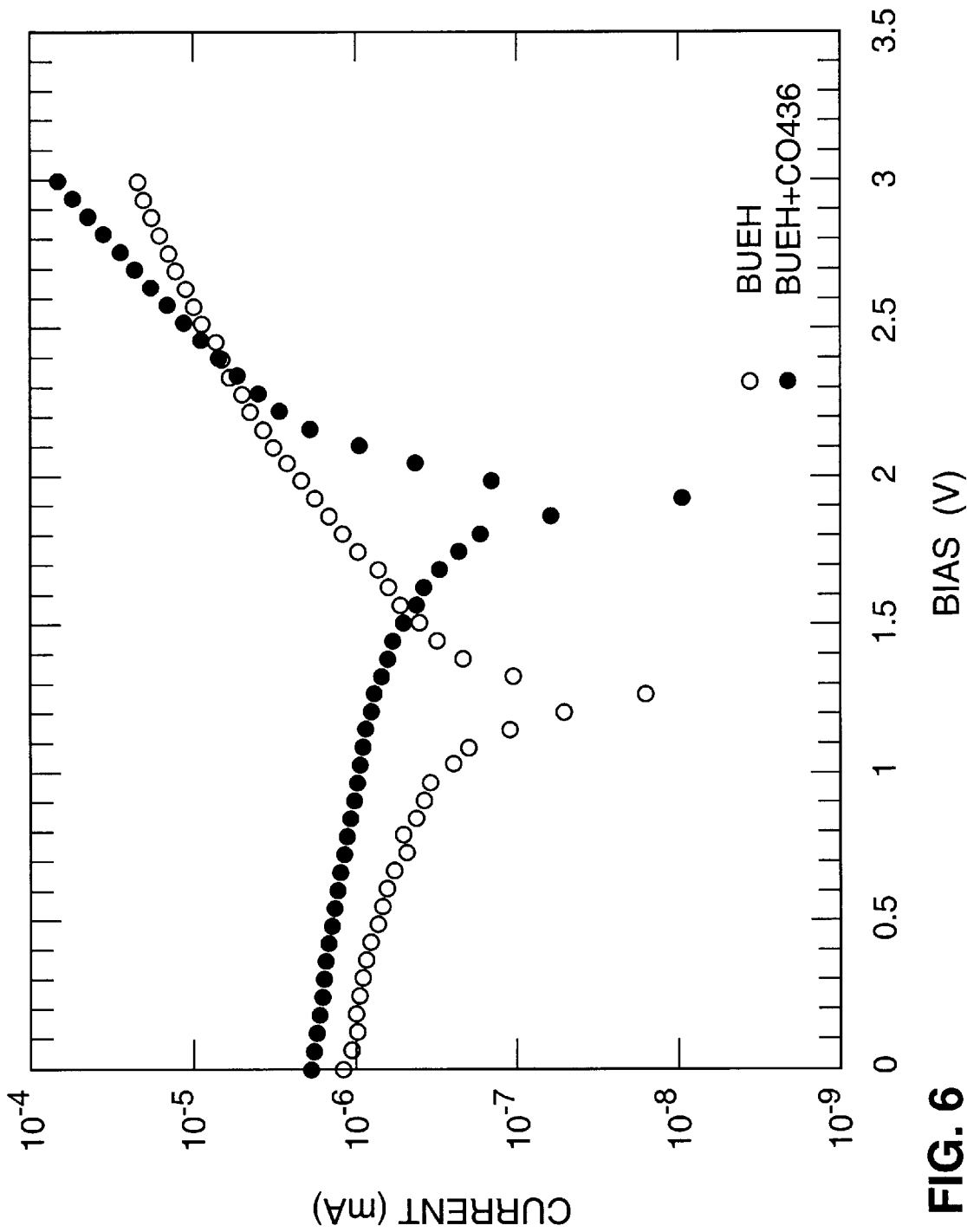
FIG. 6 is a graph that shows the open circuit voltage for a ITO/BUEH-PPV +additive/Al device with green light emission, where BUEH-PPV is poly (2-butyl-5-(2'-ethylhexyl)-1,4-phenylenevinylene).

FIG. 6 shows similar data obtained in the case of BUEH-PPV as the semiconducting polymer. The open circuit voltage increased to 1.9 V for devices with the additive.

This example showed that small amounts of the polarizable surfactant additive dramatically change the interface properties between cathode and the electroluminescent polymer. The increase in open circuit voltage is a signature of the interface property which significantly improves electron injection.

Comparative Example

LEC devices were fabricated for comparative purposes according to available references (Science, 269 (1995) 1086; U.S. patent application Ser. No. 08/268763 (Jun. 28, 1994,) and Cao et al., Appl. Phys. Lett., 68 (1996) 3218). MEH-PPV, polyethylene oxide, PEO and lithium trifluoromethanesulfonate, Li-triflate, were used as the active light-emitting layer between ITO and aluminum electrodes. The composition was: MEH-PPV:PEO:Li=2:1:0.05; 2:1:0.005 and 2:1:0.0005. Similar device performance was obtained to that reported previously (Q. Pei, G. Yu, C. Zhang, Y. Yang, and A. J. Heeger, Science, 269 (1995) 1086; Q. Pei and F. Klavetter, U.S. patent application Ser. No. 08/268763 (Jun. 28, 1994)).

Example 10

According to mechanism of LECs proposed by Q. Pei et al (Science, 269 (1995), 1086) there are precise criteria which distinguish polymer LEDs (injection limited diodes with conjugated polymer between asymmetric electrodes) and polymer LECs (formation in situ of p-n junction by electrochemical doping). These criteria relate to the charge accumulation at the interface between the electroluminescent polymer and the electrode (due to ion motion upon doping) and the response speed of the device. In this Example we compare the charge accumulation and the response speed of the devices fabricated according this invention and regular LEDs (fabricated as in Example 1 but without surfactant additive) and LECs fabricated according to the prior art as summarized in the Comparative Example.

Figure 7:
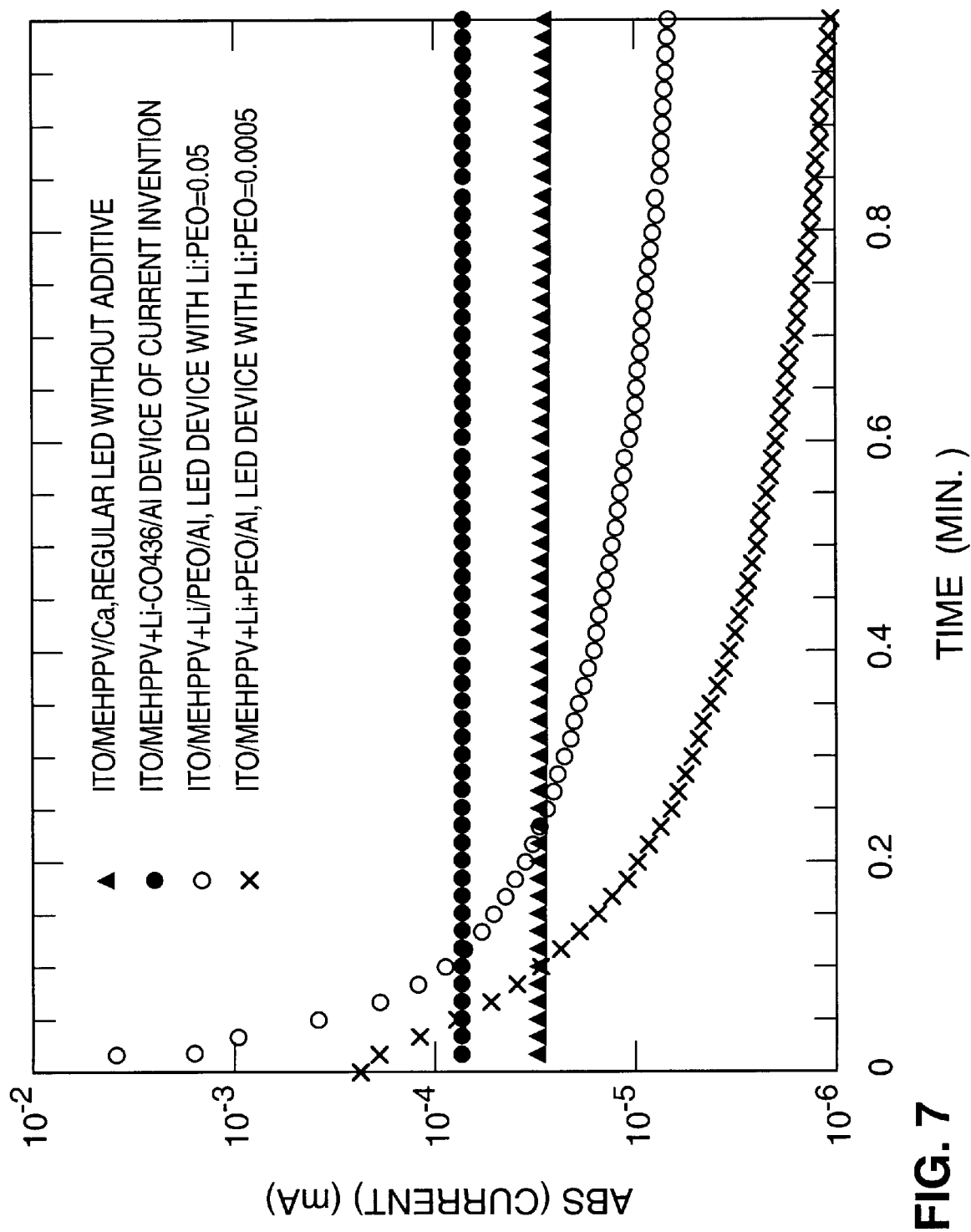
FIG. 7 is a graph that shows the decay of accumulated charge at the interface between the electroluminescent polymer and the electrodes at zero bias after the device has been turned off.

FIG. 7 shows the decay of the device at zero volts bias after stress of the device at +3 V for 20 seconds to check for charge build-up in the interface between the electrode and the El polymer. FIG. 7 compares results for these three types of devices. The results indicate that there is no charge accumulation at the interface of LEDs of current invention (as is also the case for regular polymer LEDs). In contrast, LEC devices show significant charge accumulation which decays at 0 bias. In the LEC, even at ion concentration as low as Li:PEO=0.0005, this charge accumulation is indicative that electrochemical doping (a charged electrochemical cell) has occurred at both interfaces of the electroluminescent polymer, p-type at the anode and n-type at the cathode, respectively.

Figure 8:
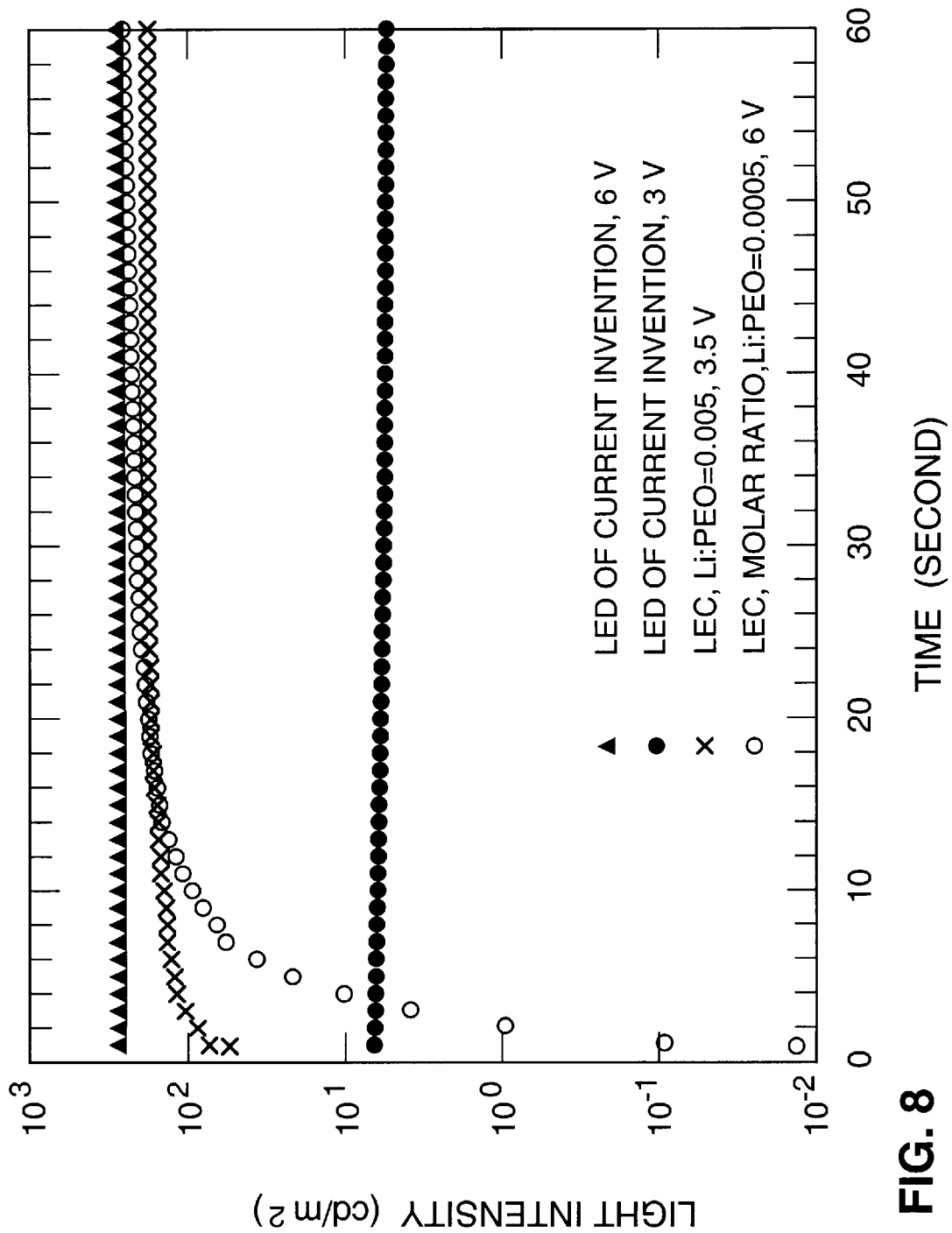
FIG. 8 is a graph which shows the difference in response speed of LED devices of the current invention and LEC devices with very low lithium triflate content.

FIG. 8 compares the response speed of the light output following k of constant voltage to devices of this invention and, for comparison, for typical LEC devices, fabricated as described in the Comparative Examples following the references cited therein. Devices of this invention showed very fast response, typical of LEDs, while LEC devices exhibited very slow response due to the low ion mobility. The response speed for LECs increased with the increasing ionic concentration.

This example demonstrates that the improved electron injection from the Al cathode is not due to electrochemical doping. This conclusion is consistent with the high rectification ratio and diode-like character of the I-V curves as shown in Example 1. This conclusion is also consistent with the fact that the magnitude of the additive-induced improvement varies for different metals as cathode materials (see Table 3 of Example 5). As shown by Pei et al (J. Amer. Chem. Soc., 118 (1996), 3922), in the case of the LEC, electron and hole injection are equally efficient even when gold (work function=5.32 eV) was used as the cathode.

Figure 9:
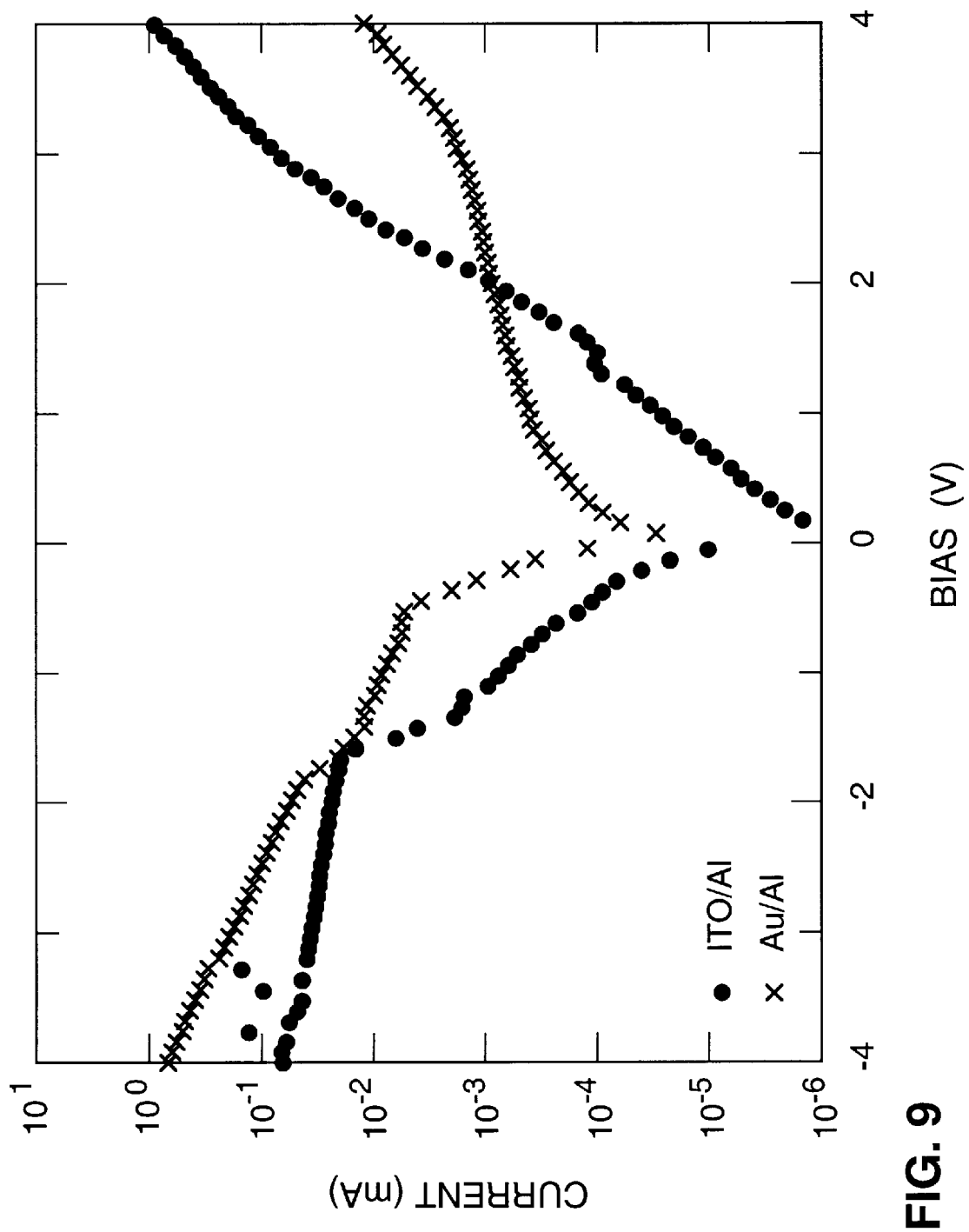
FIG. 9 is a graph which shows the I-V characteristics of LEC devices fabricated in the comparative Example (PEO:MEH-PPV=0.5; Li-triflate: PEO=0.0005).

J. C. de Mello et al J. C. de Mello, N. Tessler, S. C. Graham, X. Li, A. B. Holmes and R. H. Friend, Synth. Met. (preprint, Proceedings of ICSM '96, Synth. Met., in press) have reported that they observed rectifying characteristics for LEC devices with low ionic concentrations (the molar ratio of Li-triflate to PEO was 0.0025). This is not surprising based on the known mechanism of operation of LECs (Q. Pei, G. Yu, C. Zhang, Y. Yang, and A. J. Heeger, Science, 269 (1995), 1086 and J. Amer. Chem. Soc., 118 (1996) 3922; Q. Pei and F. Klavetter, International Patent No. WO 96/00983. Many factors can cause this apparent asymmetric behavior in the I-V characteristic and light output. Most important are the following: different electrochemical properties of cathode and anode, if they are different materials or prepared differently; differences in n-doping and p-doping ability of the conjugated polymer; different chemical nature of interface between conjugated polymer and cathode and anode; and hysterisis resulting from the kinetics of doping at positive and negative bias (speed of changing the sign of the direction of the built-in p-n junction). More precise criteria to distinguish polymer LEDs (injection limited diodes with conjugated polymer between asymmetric electrodes) and polymer LECs (in situ formation of a p-n junction by electrochemical doping) relate to the charge accumulation at the interface between the electroluminescent polymer and the electrode (due to ion motion upon doping) (FIG. 7) and the response speed of the device (FIG. 8). As shown in FIG. 9, even at salt concentrations as low as 0.00025 (ratio of Li-triflate to PEO), the asymmetry of I-V characteristic (and also light output) changed direction if one used gold as the anode. Most importantly, even at this low concentration (one order of magnitude less than that in the work of de Mello et al.) one can observe built-in charge similar to that observed in FIG. 7 for LECs with Li/PEO equal to 0.025 but with much slower response speed than the latter. For LECs, the response is very slow for low ion concentration devices and increases with increasing ion concentration (see FIG. 8). Thus, even the device of de Mello et al, shows asymmetric (non-rectifying) I-V characteristics at quasi-electrochemical equilibrium; it is a typical LEC device.

Example 11

Figure 10:
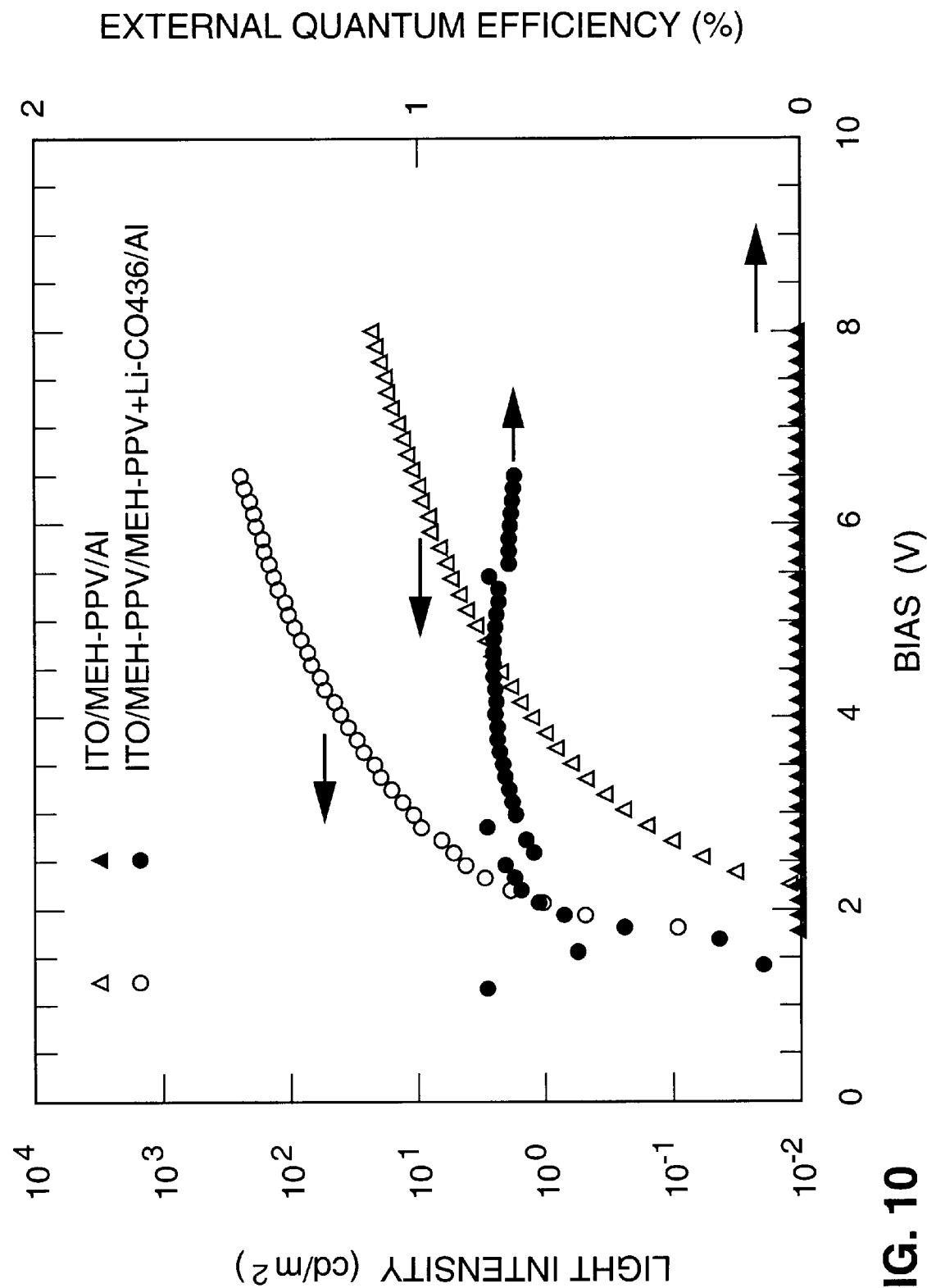
FIG. 10 is a graph that shows that a multi-layer device can be fabricated using an additive-containing electroluminescent polymer as the electron injecting layer.

Example 1 was repeated, but multi-layer devices were fabricated. On top of ITO-coated glass, 1,000 Å of plain MEH-PPV (without additive) was spin-cast from solution in xylene (0.6%). The film was then dried at 60° C. on a hot plate in Ar atmosphere for 1 hour. Then, on top of the pure MEH-PPV layer, a very thin layer (500 Å) of MEH-PPV containing 10% Li-CO436 was spin-cast from solution in toluene (0.4%), as in Example 1. The coated substrates were then transferred into a thermal evaporator, in which a 2000 Å aluminum cathode film was deposited on top of the MEH-PPV+Li-CO436 composite layer. FIG. 10 compares the external quantum efficiency and light output of devices with and without the second (additive-containing layer). As seen from the data summarized in FIG. 10, the light output and external quantum efficiency of devices with the second blend layer are two orders of magnitude higher than those without the second layer.

This example shows that a thin blend layer containing polarizable surfactant additive acts like an electron injection layer which improves electron injection from high work function cathodes such as aluminum. This result also shows that the effect of additive is completely concentrated at the interface between the electroluminescent polymer and the cathode. This conclusion was also supported by the fact that the electroluminescent spectra remains the same whether or not the additive was present.

Example 12

Example 1 was repeated, but multi-layer devices were fabricated. On top of ITO-coated glass, 1,000 Å of plain MEH-PPV (without additive) was spin-cast from solution in xylene (0.6%). The film was then dried at 60° C. on a hot plate in Ar atmosphere for 1 hour. Then on top of the pure MEH-PPV layer, a very thin layer (50–200 Å) of pure Li-CO436, Li-NPES930, Li-NPES2030, Li-NPES3030, Li-ESY, Li-ES-2, Li-ES, Li-EA603, LiRE410, Li-RM410 and Li-PL620 was spin-cast from solution in hexane (which is non-solvent for MEH-PPV) (0.4% w/w) at 6,000 rpm. The coated substrates were then transferred into a thermal evaporator, in which a 2,000 Å aluminum cathode film was deposited on top of the Li-CO436 layer. Table 9 compares the device performance of ITO/MEH-PPV/Al devices with or without an additive layer between EL polymer and Al cathode.

Similar results can be obtained for the other EL polymers. The results with BUEH-PPV are also listed in Table 9. As seen from the data summarized in Table 9, the light output and external quantum efficiency of devices with a thin layer of highly polarizable additive between EL polymer and cathode are two orders of magnitude higher than those without the second layer. The devices with a thin layer of additive can be operated at much lower voltage, although it is electrical insulater.

This example shows that a thin layer of polarizable surfactant additive alone improves electron injection from high work function cathodes such as aluminum. This result shows again that the effect of additive is completely concentrated at the interface between the EL polymer and the cathode. And this example further distinguishes the devices of the current invention with those of previous art of LEC devices.

TABLE 9

Device performance of LED devices with thin Li-CO436 additive layer between EL polymer and Al cathode.
DEVICE PERFORMANCE

| El Polymer | Additive Layer | Cathode | V (V) | I (mA) | light (cd/m2) | eff % |
|---|---|---|---|---|---|---|
| MEH-PPV | — | Al | 15 | 3.9 | 0.7 | 0.002 |
| MEH-PPV | Li-CO436 | Al | 6 | 14.4 | 796 | 2.6 |
| MEH-PPV | Li-NPES930 | Al | 10 | 13.4 | 48.2 | 0.17 |
| MEH-PPV | Li-NPES2030 | Al | 10 | 7.6 | 50.7 | 0.32 |
| MEH-PPV | Li-NPES3030 | Al | 7.7 | 10 | 190 | 0.90 |
| MEH-PPV | Li-ESY | Al | 5.6 | 5 | 68 | 0.6 |
| MEH-PPV | Li-ES-2 | Al | 5.0 | 5.0 | 240 | 2.3 |
| MEH-PPV | Li-ES | Al | 5.1 | 5.0 | 278 | 2.6 |
| MEH-PPV | Li-EA603 | Al | 8.1 | 10 | 346 | 1.63 |
| MEH-PPV | Li-RM410 | Al | 12 | 6.7 | 65.0 | 0.46 |
| MEH-PPV | L-RE410 | Al | 18.9 | 18.9 | 280 | 0.70 |
| MEH-PPV | Li-PL620 | Al | 6.1 | 10 | 427 | 2.0 |
| BUEH-PPV | — | Al | 18 | 7.2 | 1.1 | 0.01 |
| BUEH-PPV | Li-CO436 | Al | 12 | 8.9 | 1058 | 1.6 |

Example 13

Figure 11:
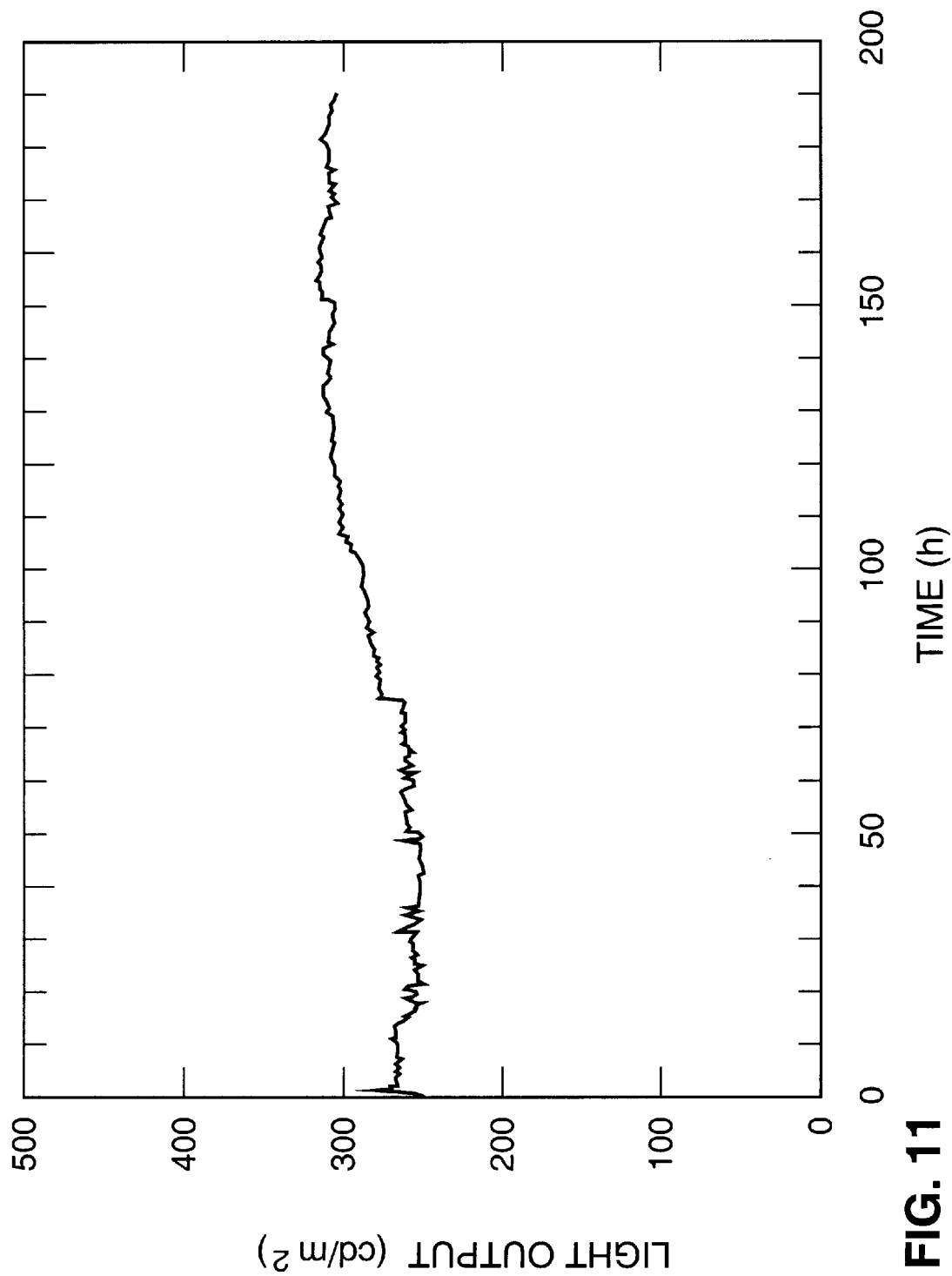
FIG. 11 is a graph that shows the brightness of a ITO/PANI/MEH-PPV+additive/Al device under stress, operated at constant current (35 mA/cm$^2$) for 200 hours.
Figure 12:
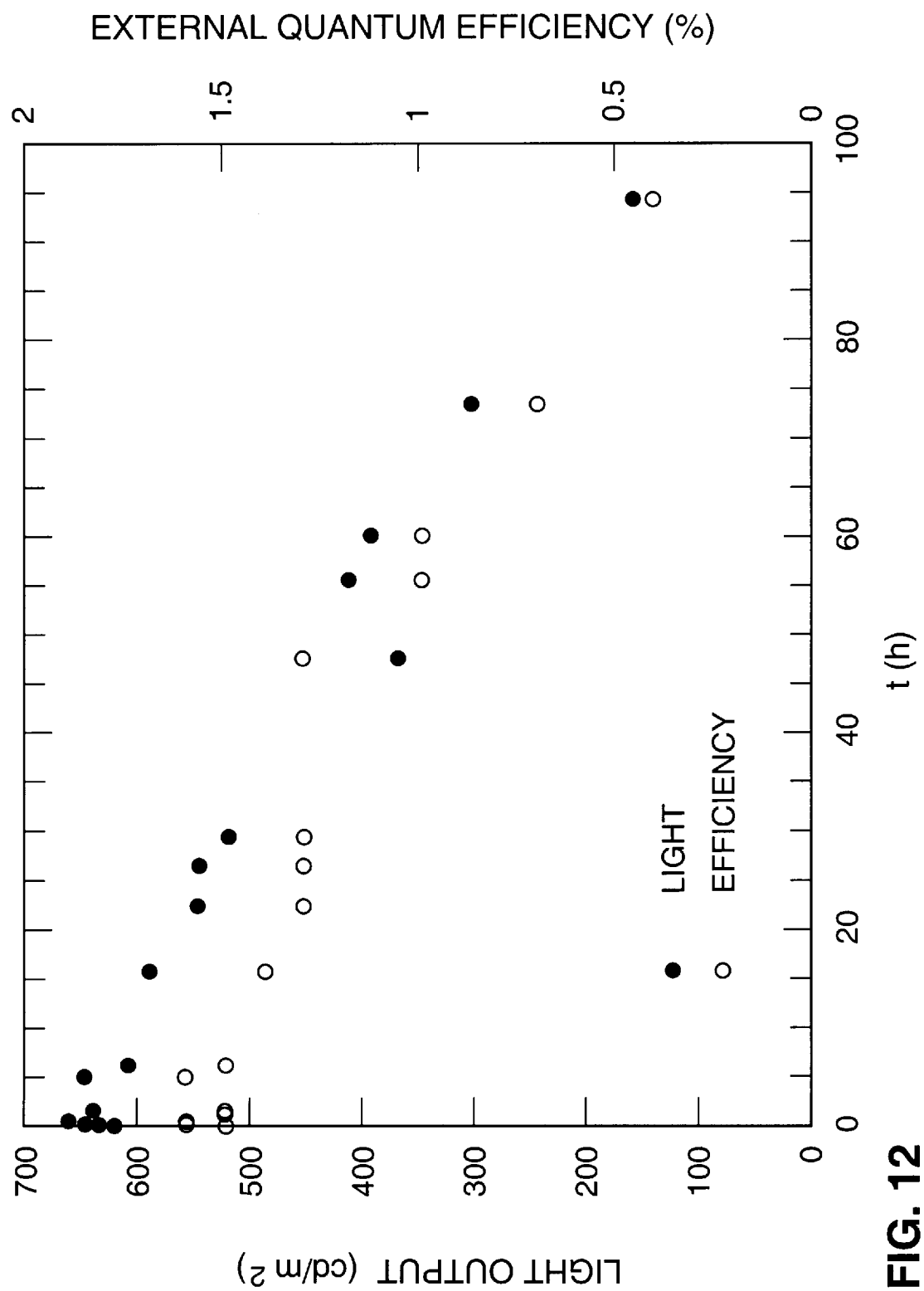
FIG. 12 is a graph that shows the shelf life of a ITO/PANI/MEH-PPV+additive/Al device in ambient air without any encapsulation.

Devices of the current invention show good stress life. FIG. 11 shows the performance under stress of a device at a constant current of 35 mA/cm². As can be seen from FIG. 11, the light output was ca. 300 cd/m² for 200 hours without any essential change during this period. FIG. 12 shows the decay of the light output and the external quantum efficiency of a non-encapsulated device with a aluminum cathode in ambient air (temperature ca. 25° C., humidity: 50%). As can be seen from FIG. 12, in first 5–10 hours both the light output and the quantum efficiency are practically constant and without degradation. Because of the high reactivity of low work function metals such as calcium with oxygen and water in air, immediate decay was observed in air for devices with low work function metals as cathode.

I claim:

1. In a light-emitting diode having an electroluminescent medium comprising an electroluminescent conjugated organic polymer and an ionic species source electrically connected to an anode and a cathode, the improvement comprising employing an ionic species source comprising an organic anionic surfactant.

2. The improved light-emitting diode of claim 1 wherein the electroluminescent medium comprises one part by weight of electroluminescent conjugated organic polymer and 0.99 to 0.001 part by weight of organic anionic surfactant.

3. The improved light-emitting diode of claim 2 wherein the electroluminescent medium comprises one part by weight of electroluminescent conjugated organic polymer and 0.50 to 0.01 part by weight of organic anionic surfactant.

4. The improved light-emitting diode of claim 3 further improved by a cathode having a work function equal or larger than 4.0 eV, said light-emitting diode showing rectification ratio at least 10³ or larger, said light-emitting device having external quantum efficiency at least 100 times larger than that of a conventional device with the same electroluminescent polymer and cathode but without the additive.

5. The improved light-emitter diode of claim 4 wherein the cathode is selected from aluminum, silver, platinum, gold, palladium, tungsten, indium, zinc, copper, nickle, iron, lead, zirconium, graphite, and alloys thereof.

6. The improved light-emitting diode of claim 1 wherein the electrically active organic polymer is admixed with the organic anionic surfactant.

7. The improved light-emitting diode of claim 1 wherein the electrically active organic polymer and the organic anionic surfactant are present as separate contiguous layers.

8. The improved light-emitting diode of claim 1 wherein the surfactant is selected from an organosulfate of the formula $R^*-O-SO_3^-M^+$, an organophosphate of the formula $R^*-O-PO_3^{-2}M_2^+$ and an organophosphate of the formula $(R^*-O)_2-PO_2^-M^+$ wherein $R^*$ is a hydrophobic organo group and $M^+$ is selected from the group consisting of a proton, an ammonium and a metal cation.

9. The improved light-emitting diode of claim 8 wherein $R^*$ is a hydrocarbyl or oxyhydrocarbyl having from about 5 carbons to about 100 carbons and up to about 40 oxygens.

10. The improved light-emitting diode of claim 9 wherein the surfactant is selected from the group consisting of an ether sulfate and an ether phosphate.

11. The improved light-emitting diode of claim 10 wherein the surfactant is an ether sulfate of the formula $RO(CH_2CH_2O)_nSO_3^-M^+$, wherein R is selected from the group consisting of alkyl, alkenyl, alkylaryl, and alkenylaryl; and n is an integer from 2 to 40 inclusive.

12. The improved light-emitting diode of claim 11 wherein the surfactant is an ether sulfate selected from the group consisting of a salt of nonylphenoxy ether sulfate where n equals 4, 9, 20, or 30, and a salt of lauryl ether sulfate.

13. The improved light-emitting diode of claim 12 wherein the surfactant is the ammonium salt of nonylphenoxy ether sulfate and n equals 4, 9, 20 or 30.

14. The improved light-emitting diode of claim 12 wherein the surfactant is the sodium of salt of nonylphenoxy ether sulfate and n equals 4.

15. The improved light-emitting diode of claim 12 wherein the surfactant is the sodium salt of lauryl ether sulfate and n equals 1, 2 or 3.

16. The improved light-emitting diode of claim 12 wherein the surfactant is the ammonium salt of lauryl ether sulfate and n equals 1, 2 or 3.

17. The improved light-emitting diode of claim 10 wherein the surfactant is an ether phosphate selected from the formulae

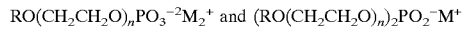

$$RO(CH_2CH_2O)_nPO_3^{-2}M_2^+ \text{ and } (RO(CH_2CH_2O)_n)_2PO_2^-M^+$$

wherein R is selected from alkyl, alkenyl, alkylaryl, and alkenylaryl; and n is an integer from 2 to 40 inclusive.

18. The improved light-emitting diode of claim 17 wherein the electroluminescent polymer comprises a homopolymer or copolymer having the units selected from the group consisting of substituted and unsubstituted p-phenylene vinylene, substituted and unsubstituted p-phenylene, substituted and unsubstituted quinoline, substituted and unsubstituted p-phenylene-2,6-benzobisthiazole, substituted and unsubstituted p-phenylene-2,6-benzobisoxazole, substituted and unsubstituted p-phenylene-2,6-benzimidazole, substituted and unsubstituted arylene, and substituted and unsubstituted arylene vinylene, wherein arylene is naphthalene, anthracene, furylene, thienylene, pyrrole, oxadiazole, or isothianaphthene and mixtures thereof.

19. The improved light-emitting diode of claim 18 wherein the anode is selected from indium/tin-oxide, tin-oxide, semitransparent gold, semitransparent silver semitransparent copper, conducting polyaniline, conducting polypyrrole, conducting polythiophene, and derivatives and mixtures thereof.

20. The improved light-emitting diode of claim 17 wherein the surfactant is polyoxytheylene nonylphenyl ether phosphonic acid and n equals 4.

21. The improved light-emitting diode of claim 17 wherein the surfactant is polyoxytheylene dinonylphenyl ether phosphonic acid and n equals 4.

22. The improved light-emitting diode of claim 17 wherein the surfactant is polyoxytheylene alkyl ether phosphonic acid and n equals 6.

23. The improved light-emitting diode of claim 8 wherein $M^+$ is selected from the group consisting of lithium, sodium, potassium, rubidium and cesium cations.

24. The improved light-emitting diode of claim 23 wherein $M^+$ is lithium cation.

25. The improved light-emitting diode of claim 1 wherein the organic anionic surfactant is an intimate dispersion in the electroluminescent conjugated organic polymer.

26. The improved light-emitting diode of claim 1 wherein the organic anionic surfactant is a solid solution in the electroluminescent conjugated organic polymer.

\* \* \* \* \*